(12) United States Patent
Shimabukuro et al.

(10) Patent No.: US 11,473,199 B2
(45) Date of Patent: Oct. 18, 2022

(54) METHOD AND APPARATUS FOR DEPOSITING A MULTI-SECTOR FILM ON BACKSIDE OF A SEMICONDUCTOR WAFER

(71) Applicant: SANDISK TECHNOLOGIES LLC, Addison, TX (US)

(72) Inventors: Seiji Shimabukuro, Yokkaichi (JP); Makoto Tsutsue, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 9 days.

(21) Appl. No.: 16/897,679

(22) Filed: Jun. 10, 2020

(65) Prior Publication Data

US 2021/0388500 A1    Dec. 16, 2021

(51) Int. Cl.
*H01J 37/32*  (2006.01)
*C23C 16/509*  (2006.01)
*H01L 21/02*  (2006.01)
*H01L 27/11556*  (2017.01)
*H01L 21/67*  (2006.01)
(Continued)

(52) U.S. Cl.
CPC .......... *C23C 16/509* (2013.01); *C23C 16/345* (2013.01); *H01J 37/3244* (2013.01); *H01J 37/32082* (2013.01); *H01J 37/32568* (2013.01); *H01J 37/32715* (2013.01); *H01J 37/32899* (2013.01); *H01L 21/022* (2013.01); *H01L 21/0217* (2013.01); *H01L 21/02274* (2013.01);
(Continued)

(58) Field of Classification Search
CPC ... C23C 16/509; C23C 16/345; C23C 16/042; C23C 16/56; H01J 37/32082; H01J 37/32715; H01J 37/32568; H01J 37/3244; H01J 2237/3321; H01J 37/32899; H01L 21/022; H01L 27/11556; H01L 27/11582; H01L 21/67167; H01L 21/0217; H01L 21/02274; H01L 21/302; H01L 21/67706
USPC ............ 156/345.23, 345.44, 345.47, 345.51; 438/706, 714, 761
See application file for complete search history.

(56) References Cited

U.S. PATENT DOCUMENTS 8,211,510 B1    7/2012  Varadarajan et al.
9,343,358 B1    5/2016  Xu
(Continued)

OTHER PUBLICATIONS

U.S. Appl. No. 16/248,923, filed Jan. 16, 2019, SanDisk Technologies LLC.
(Continued)

*Primary Examiner* — Lan Vinh
(74) *Attorney, Agent, or Firm* — The Marbury Law Group PLLC

(57) ABSTRACT

A patterned backside stress compensation film having different stress in different sectors is formed on a backside of a substrate to reduce combination warpage of the substrate. The film can be formed by employing a radio frequency electrode assembly including plurality of conductive plates that are biased with different RF power and cause local variations in the plasma employed to deposit the backside film. Alternatively, the film may be deposited with uniform stress, and some of its sectors are irradiated with ultraviolet radiation to change the stress of these irradiated sectors. Yet alternatively, multiple backside deposition processes may be sequentially employed to deposit different backside films to provide a composite backside film having different stresses in different sectors.

9 Claims, 16 Drawing Sheets

(51) Int. Cl.
  *H01L 27/11582* (2017.01)
  *H01L 21/677* (2006.01)
  *C23C 16/34* (2006.01)

(52) U.S. Cl.
  CPC .. *H01L 21/67167* (2013.01); *H01L 21/67706* (2013.01); *H01L 27/11556* (2013.01); *H01L 27/11582* (2013.01); *H01J 2237/3321* (2013.01)

(56) References Cited

U.S. PATENT DOCUMENTS

| | | | |
|---|---|---|---|
| 10,355,012 B2 | 7/2019 | Shimabukuro et al. | |
| 2008/0286918 A1 | 11/2008 | Shaviv | |
| 2009/0250443 A1* | 10/2009 | Kim | H01L 21/67069 219/121.36 |
| 2011/0244690 A1 | 10/2011 | Shanker et al. | |
| 2012/0090545 A1 | 4/2012 | Chiang et al. | |
| 2013/0340937 A1* | 12/2013 | Yamazawa | H01J 37/32091 156/345.27 |
| 2016/0020135 A1* | 1/2016 | Kawamura | H01L 21/68735 156/345.35 |
| 2016/0189934 A1 | 6/2016 | Nozawa | |
| 2018/0068860 A1 | 3/2018 | deVilliers et al. | |
| 2018/0374865 A1 | 12/2018 | Shimabukuro et al. | |
| 2019/0035646 A1 | 1/2019 | Nasman et al. | |
| 2020/0105523 A1 | 4/2020 | Liu et al. | |
| 2020/0105531 A1 | 4/2020 | Liu | |

OTHER PUBLICATIONS

U.S. Appl. No. 16/263,058, filed Jan. 31, 2019, SanDisk Technologies LLC.
U.S. Appl. No. 16/263,086, filed Jan. 31, 2019, SanDisk Technologies LLC.
U.S. Appl. No. 16/417,913, filed May 21, 2019, SanDisk Technologies LLC.
U.S. Appl. No. 16/535,505, filed Aug. 8, 2019, Western Digital Technologies, INC.
U.S. Appl. No. 16/867,818, filed May 6, 2020, SanDisk Technologies LLC.
U.S. Appl. No. 16/867,845, filed May 6, 2020, SanDisk Technologies LLC.
Shimabukuro, S. et al., "Method and Apparatus for Depositing a Multi-Sector Film on Backside of a Semiconductor Wafer," U.S. Appl. No. 16/897,717, filed Jun. 10, 2020.
Tian, J. et al., "Stress Modulation of Silicon Nitride Film by Initial Deposition Conditions for Transistor Carrier Mobility Enhancement," Japanese Journal of Applied Physics, vol. 49, (05FB01), 5 pages, (2010).
Invitation to Pay Additional Fees and Annex to Form PCT/ISA/206 Communication Relating to the Results of the Partial International Search of the International Searching Authority for International Patent Application No. PCT/US2020/067259, dated Apr. 18, 2021, 7 pages.
Notification of Transmittal of the International Search Report and the Written Opinion of the International Searching Authority for International Patent Application No. PCT/US2020/067259, dated May 18, 2021, 14 pages.
USPTO Office Communication, Non-Final Office Action for U.S. Appl. No. 16/897,717, dated Dec. 21, 2021, 32 pages.
USPTO Office Communication, Final Office Action for U.S. Appl. No. 16/897,717, dated Apr. 18, 2022, 14 pages.

* cited by examiner

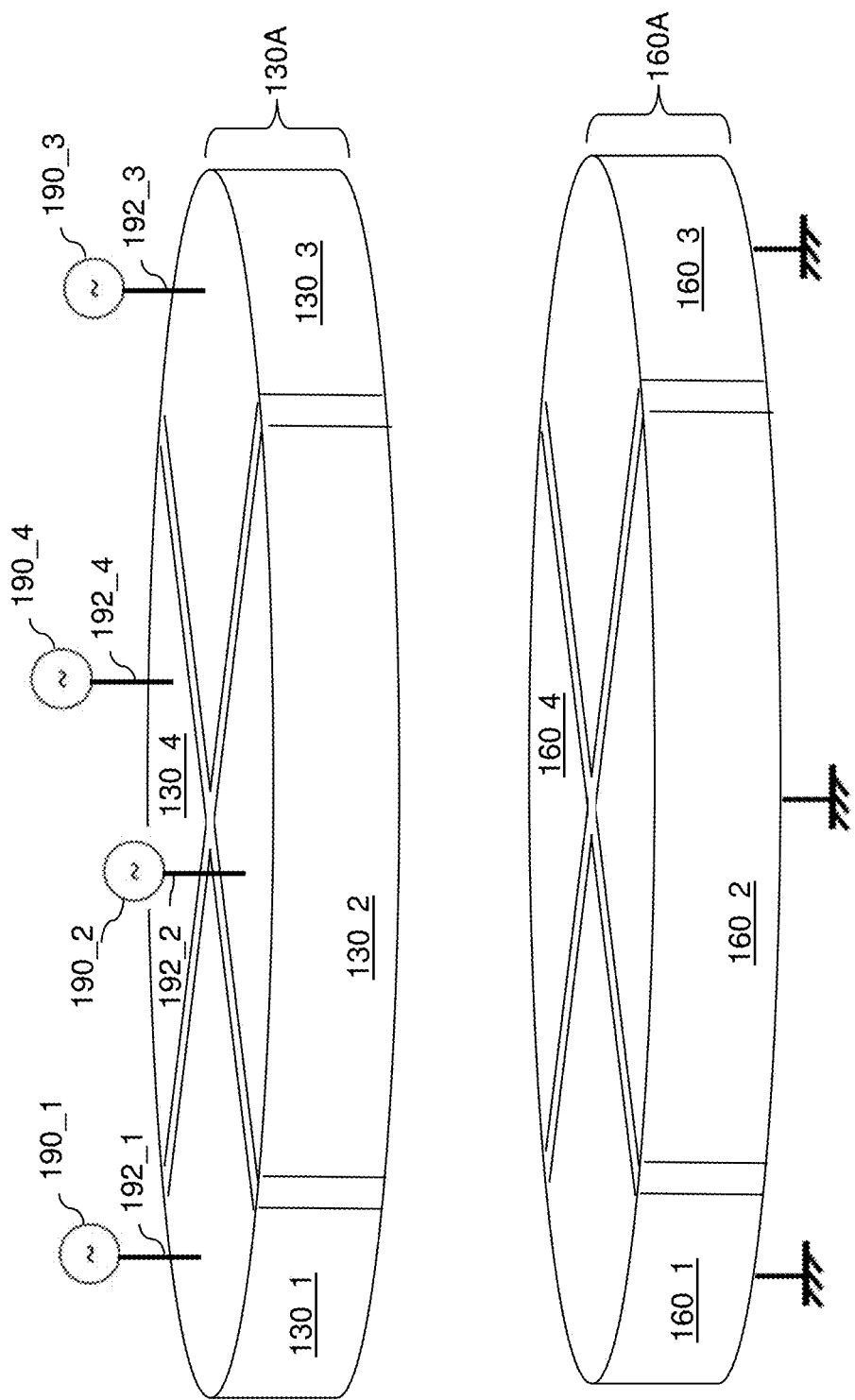

METHOD AND APPARATUS FOR DEPOSITING A MULTI-SECTOR FILM ON BACKSIDE OF A SEMICONDUCTOR WAFER

FIELD

The present disclosure relates generally to the field of semiconductor manufacturing methods and apparatuses, and particularly to a method and apparatus for depositing a film having different stress in different sectors on a backside of a semiconductor wafer.

BACKGROUND

Three-dimensional memory devices, such as vertical NAND devices, employ a stack of multiple word line spaced apart by insulating layers. Memory stack structures vertically extend through each layer within the stack.

SUMMARY

According to one embodiment of the present disclosure, a backside film deposition apparatus comprises a vacuum enclosure, an upper electrode located within the vacuum enclosure, a susceptor located within the vacuum enclosure, a lower electrode located within the susceptor, a hollow ring shaped substrate holder located between the upper electrode and the susceptor and configured to support a substrate such that a plurality of plasma zones are located between the substrate holder and the susceptor, and a plurality of radio frequency power sources. At least one of the upper electrode or the lower electrode comprises a radio frequency electrode assembly comprising a plurality of conductive plates that are electrically isolated from each other, and the plurality of radio frequency power sources are configured to apply different power to different conductive plates to generating a different plasmas in different plasma zones to deposit a backside stress compensation film having tensile and compressive stress sectors on a backside of a substrate facing the susceptor.

According to another embodiment of the present disclosure, a method of fabricating a semiconductor device comprises forming a semiconductor device over a front surface of a substrate which generates alternating compressive stress sectors in the substrate which are under compressive stress and tensile stress sectors in the substrate which are under tensile stress, and depositing a backside stress compensation film in a single deposition step on a backside of the substrate, wherein the backside stress compensation film contains alternating compressive stress sectors which are under compressive stress and are located under the compressive stress sectors in the substrate, and tensile stress sectors which are under tensile stress are located under the tensile stress sectors in the substrate.

According to another embodiment of the present disclosure, a backside film deposition apparatus comprises a vacuum enclosure, an upper electrode located within the vacuum enclosure, a susceptor located within the vacuum enclosure, a lower electrode located within the susceptor, a hollow ring shaped substrate holder located between the upper electrode and the susceptor and configured to support a substrate, and a backside masking connected to the substrate holder and having at least one sector shaped opening therethrough underneath at least one region of the upper electrode.

According to yet another embodiment of the present disclosure, a method of forming a composite backside stress compensation film comprises disposing a substrate on a substrate holder located in a vacuum enclosure such that at least two sectors of a backside of the substrate facing a susceptor are exposed through at least two sector shaped openings in a first patterned backside masking plate connected to the substrate holder, flowing a precursor gas into the vacuum enclosure between the substrate and the susceptor, depositing a first backside stress compensation film having a compressive or tensile stress in at least two odd numbered sectors on the backside of the substrate through the at least two sector shaped openings in the first patterned backside masking plate, and depositing a second backside stress compensation film having another one of the compressive or tensile stress in at least two even numbered sectors on the backside of the substrate. Each of the odd numbered sectors is located between two even numbered sectors, and the second backside stress compensation film has a different chemical composition than the first backside stress compensation film.

According to another embodiment of the present disclosure, a film deposition system comprises a backside film deposition chamber configured to deposit a film on a backside of a substrate, an ultraviolet radiation treatment chamber comprising a lower support ring configured to hold a substrate thereupon, an ultraviolet radiation source, and a backside masking plate located between the lower support ring and the ultraviolet radiation source, and including at least one sector shaped opening therethrough, and a transfer chamber adjoined to the backside film deposition chamber and the ultraviolet radiation treatment chamber.

According to yet another embodiment of the present disclosure, a method of fabricating a semiconductor device comprises providing a substrate containing a semiconductor device located over a front surface of a substrate which generates alternating compressive stress sectors in the substrate which are under compressive stress and tensile stress sectors in the substrate which are under tensile stress, and a backside stress compensation film under compressive stress located on a backside of the substrate, and irradiating even numbered sectors of the backside stress compensation film with ultraviolet radiation such that the even numbered sectors of the backside stress compensation film are under tensile stress while odd numbered sectors of the backside stress compensation film remain under compressive stress. The odd numbered sectors of the backside stress compensation film are located under the compressive stress sectors in the substrate, and the even numbered sectors of the backside stress compensation film are located under the compressive stress sectors in the substrate.

BRIEF DESCRIPTION OF THE DRAWINGS

FIG. 3D is a perspective view of a fourth exemplary configuration of the radio frequency electrode assemblies in the first exemplary backside film deposition apparatus according to the first embodiment of the present disclosure.

DETAILED DESCRIPTION

Figure 1A:
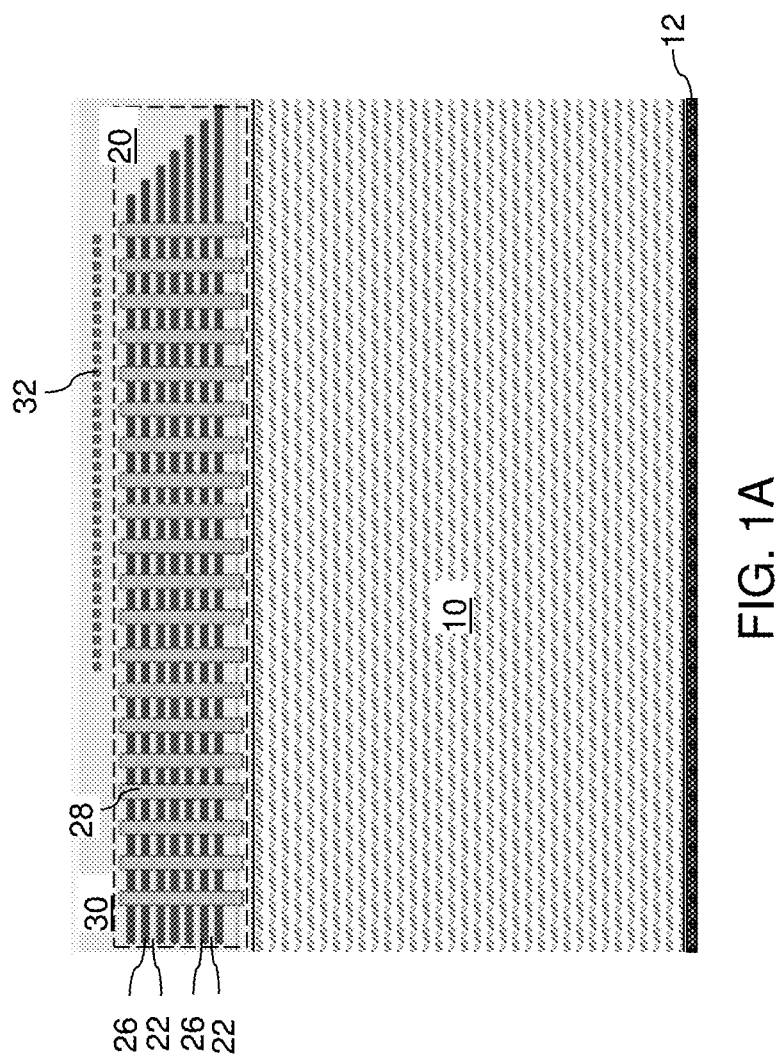
FIG. 1A is a schematic vertical cross-sectional view of semiconductor device located on a semiconductor wafer.

FIG. 1A illustrates a three-dimensional NAND memory device 20 located on a substrate 10, such as a silicon wafer. The device 20 includes a vertically alternating stack of insulating layers 22 and electrically conductive layers 26, and a two-dimensional array of memory openings vertically extending through the vertically alternating stack (22, 26). The electrically conductive layers 26 may comprise word lines of the three-dimensional NAND memory device. A memory opening fill structure 28 may be formed within each memory opening. The memory opening fill structure 28 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 28 and adjacent portions of the electrically conductive layers 26 constitute a vertical NAND string. Alternatively, the memory opening fill structures 28 may include any type of non-volatile memory elements such as resistive memory elements, ferroelectric memory elements, phase change memory elements, etc. The electrically conductive layers 26 may be patterned to provide a terrace region in which each overlying electrically conductive layer 26 has a lesser lateral extent than any underlying electrically conductive layer 26. Contact via structures (not shown) may be formed on the electrically conductive layers 26 in the terrace region to provide electrical connection to the electrically conductive layers 26. Dielectric material portions 30 may be formed around each vertically alternating stack (22, 26) to provide electrical isolation between neighboring vertically alternating stacks (22, 26). Bit lines 32 may electrically contact drain regions located above the semiconductor channel at the top of the memory opening fill structures 28.

Figure 1B:
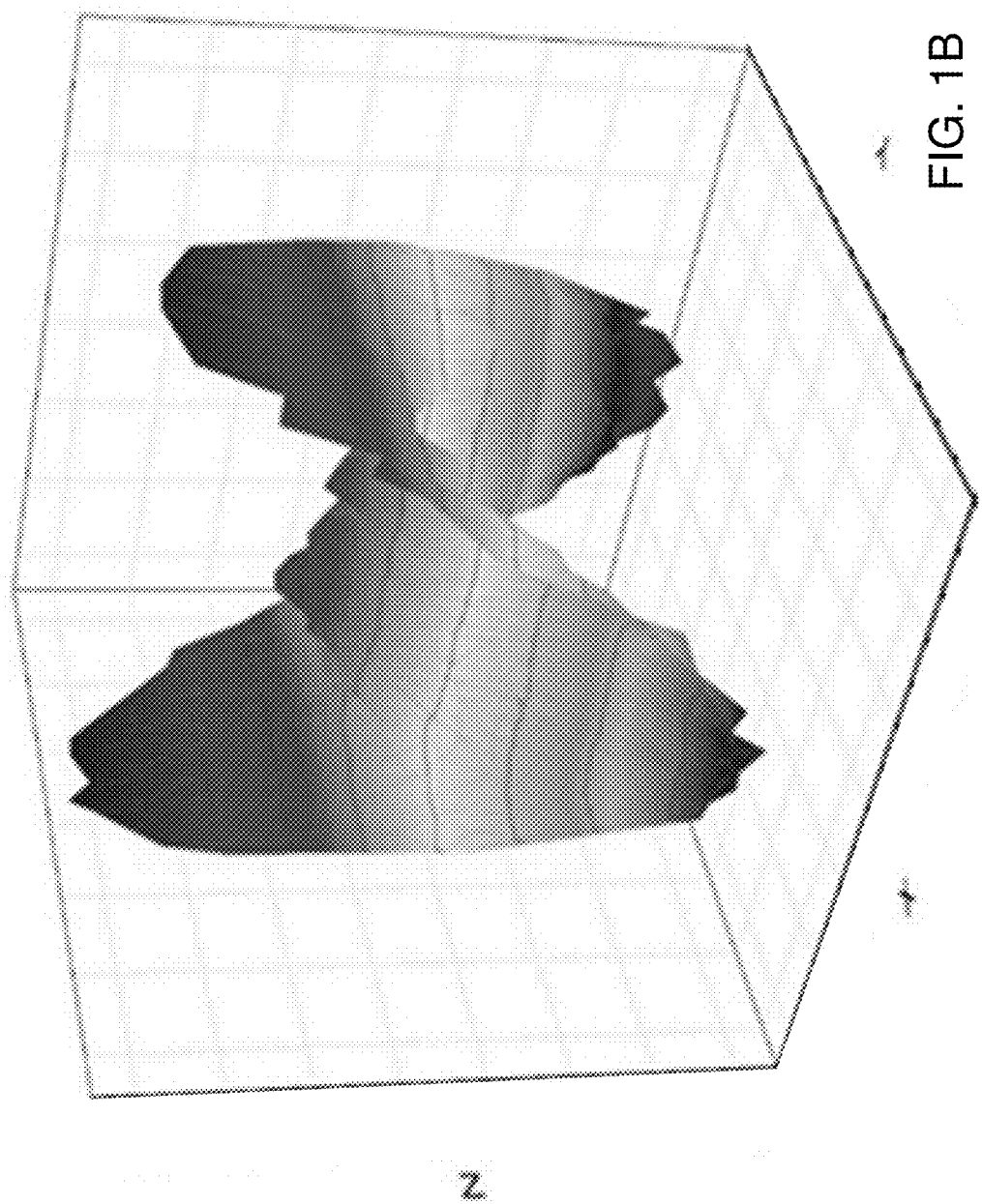
FIG. 1B is a three-dimensional graph illustrating combination wafer warpage of the semiconductor device of FIG. 1A.

The multiple word lines 26 typically extend in a single word line direction and generate significant stress at a wafer level, which can distort the wafer 10 with a combination of convex warpage and concave warpage in different sectors of the wafer 10. This combination warpage may warp the edges of the wafer upwards in the X-direction and downwards in the Y-direction, such that the wafer has a saddle shape, as shown in FIG. 1B. Wafer warpage may degrade lithographic patterning processes and/or induce arcing during plasma-enhanced chemical vapor deposition processes.

As discussed above, the present disclosure is directed to a method and apparatus for depositing a backside stress compensation film (12, 112, 212) having different stress in different sectors on a backside of a semiconductor wafer 10. The backside stress compensation film reduces the combination wafer warpage shown in FIG. 1B to make the wafer 10 more planar.

Figure 1C:
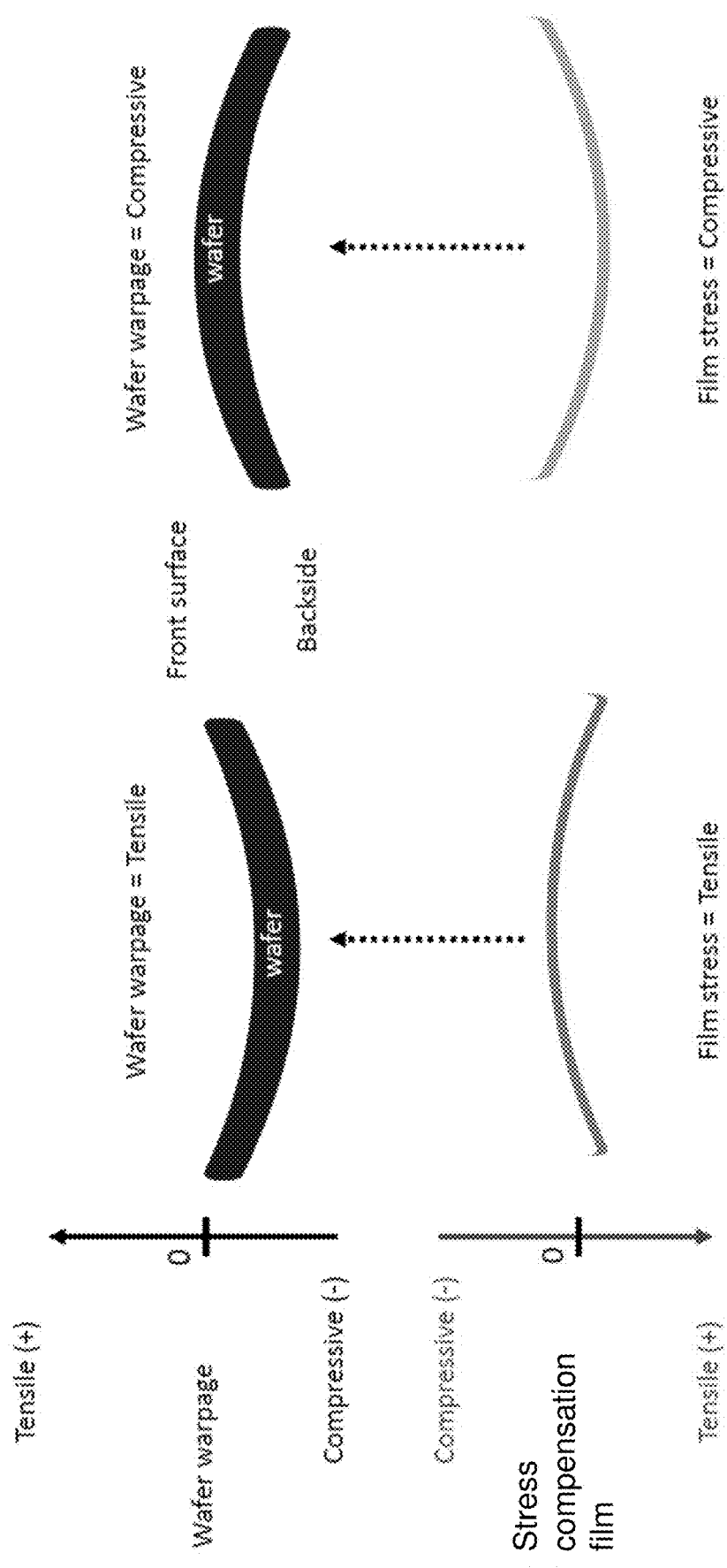
FIG. 1C is a schematic plot of wafer warpage and stress compensation film stress directions according to an embodiment.

FIG. 1C is a schematic plot of wafer 10 warpage and stress compensation film 12 stress directions according to an embodiment. The stress direction for the layers on the front surface of the wafer 10 and for the stress compensation film 12 on the backside of the wafer 10 are directed toward the wafer 10. In other words, the curvature direction for layers on the front surface of the wafer 10 and for the stress compensation film 12 on the backside of the wafer 10 that are both in the same type of stress (e.g., both in tensile stress or both in compressive stress) are opposite to each other.

For example, as shown on the left side of FIG. 1C, if the NAND memory device 20 is in tensile stress which causes the wafer 10 to be in tensile stress with its edges curled upwards, then a stress compensation film 12 in tensile stress is formed on the backside of the wafer 10. The stress compensation film 12 in tensile stress has its edges curled downward with respect to the backside of the wafer 10.

In contrast, as shown on the right side of FIG. 1C, if the NAND memory device 20 is in compressive stress which causes the wafer 10 to be in compressive stress with its edges curled downwards, then a stress compensation film 12 in compressive stress is formed on the backside of the wafer 10. The stress compensation film 12 in compressive stress has its edges curled upward with respect to the backside of the wafer 10. In both cases, the stress compensation film 12 compensates and reduces the warpage of the wafer 10.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

According to embodiments of the present disclosure, warpage of a substrate (such as a semiconductor wafer) can be reduced by forming a backside stress compensation film having different stress in different sectors on the backside of a substrate, such as a semiconductor (e.g., silicon) wafer. Contact between the front side of the substrate (e.g., the semiconductor device side 20 of a wafer 10) and any physical surface of a deposition apparatus can be avoided by employing a substrate holder (124, 224) including an annular ring structure, or a "carrier ring" structure. The annular ring structure contacts an annular peripheral region of the backside surface of the substrate 10, and suspends the substrate above a deposition region within a process chamber through which at least one process gas flows to deposit the film on the backside of the substrate.

Figure 2:
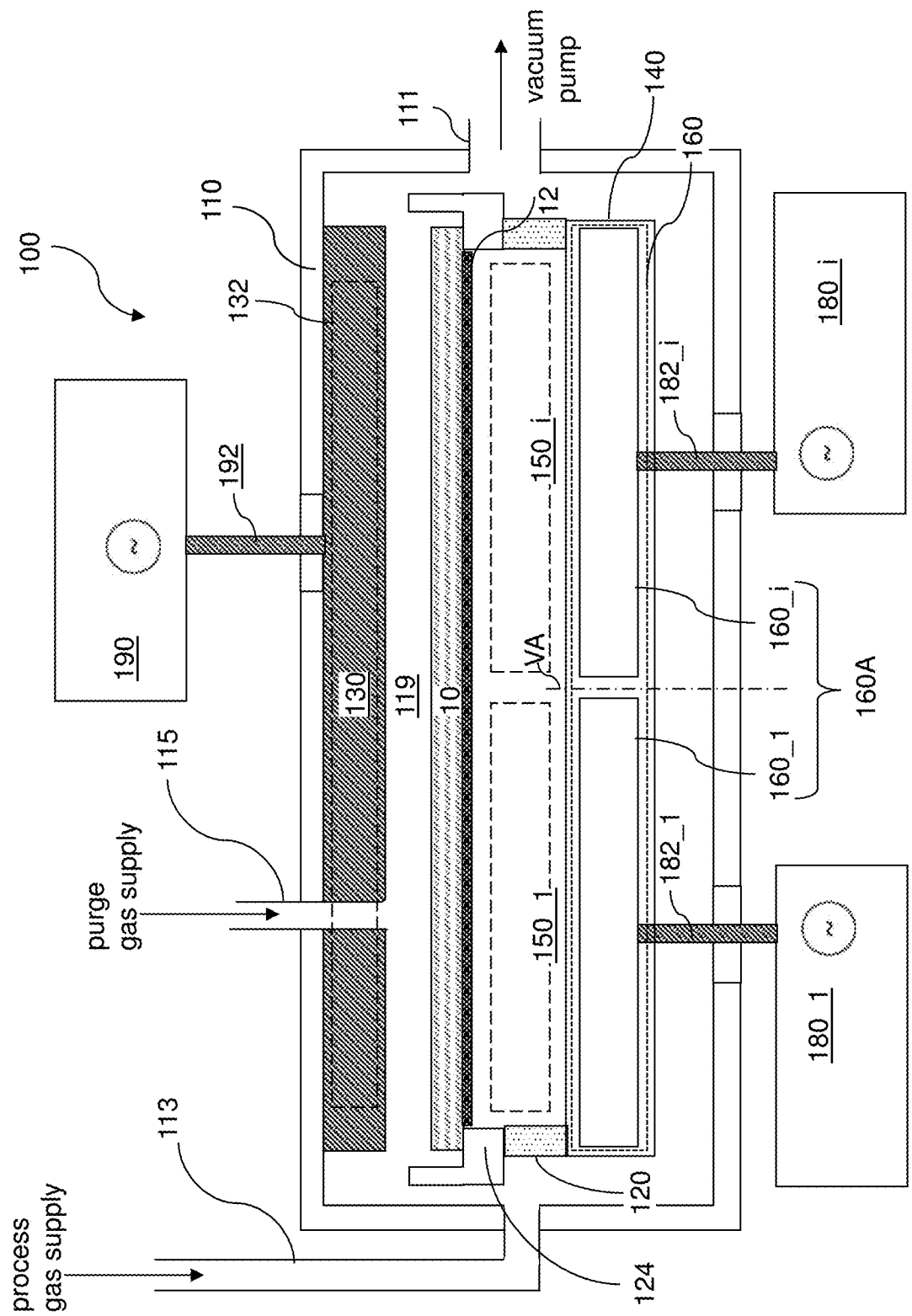
FIG. 2 is a vertical cross-sectional view of a first exemplary backside film deposition apparatus employing a radio frequency electrode assembly containing a plurality of conductive plates according to a first embodiment of the present disclosure.

Referring to FIG. 2, a first exemplary backside film deposition apparatus 100 according to a first embodiment of the present disclosure is illustrated. The first exemplary backside film deposition apparatus 100 includes a process chamber configured to perform a chemical vapor deposition (CVD) process, such as a plasma enhanced CVD (PECVD) process. The process chamber includes a vacuum chamber defined by a vacuum enclosure 110. The vacuum enclosure 110 includes multiple components such as static enclosure walls and at least one sealable opening that can be sealed by a movable door or a movable cap. For example, an opening may be provided in a sidewall of the static enclosure walls, and a slit valve may be provided to enable transfer of a substrate (such as a semiconductor wafer) therethrough. The slit valve may be configured to move out of the path of the transfer of the substrate during the transfer of the substrate, and slide into a sealing position once the substrate transfer is complete. The opening in the static enclosure walls may be connected to a transfer chamber (not illustrated), which may be maintained under vacuum or under reduced pressure to minimize influx of contaminants into the vacuum chamber and to facilitate maintenance of the base pressure within the vacuum enclosure 110. At least one vacuum pump (not expressly shown) can be attached to the vacuum enclosure 110 through a pumping port 111. The at least one vacuum pump can be configured to maintain the base pressure of the vacuum enclosure 110 in a range from 0.01 mTorr to 1 mTorr after a suitable outgassing process. The at least one vacuum pump may include a tandem combination of a turbo pump and a mechanical pump. The mechanical pump may be connected to the exhaust of the turbo pump, and can function as a roughing pump. The intake side of the turbo pump can be connected to the pumping port 111 of the vacuum enclosure 110 to enable low base pressure in the vacuum enclosure 110.

A gas supply manifold 113 configured to provide influx of at least one process gas into the vacuum enclosure 110 may be provided in the first exemplary backside film deposition apparatus 100. The gas supply manifold 113 may be configured to provide influx of the at least one process gas through a sidewall of the vacuum enclosure 110 located on an opposite side of the pumping port 111. The at least one process gas may include any process gas that can be employed for any known PECVD process in the art. Optionally, the gas supply manifold 113 may be configured to provide a carrier gas, a purge gas, and/or a backfill gas.

A susceptor 140 is located within the vacuum enclosure 110 below an upper electrode 130. The susceptor 140 may include any suitable support structure or pedestal. For example, the susceptor 140 may be made of an electrically insulating material, such as a ceramic material. Plasma zones 150_i are located between the susceptor 140 and the upper electrode 130. In one embodiment, the gas supply manifold 113 may be located in the side of the vacuum enclosure 110, as shown in FIG. 2 to laterally provide the process gas into the plasma zones 150_i between the support pillars 120 located on the susceptor 140. In other embodiments shown in FIGS. 4A and 8, the gas supply manifold 113 may extend through a bottom of the vacuum enclosure 110 and through the susceptor 140 and have openings into the plasma zones 150_i.

A lower electrode 160 is located inside the susceptor 140. In one embodiment, the lower electrode 160 includes a radio frequency (RF) electrode assembly 160A. According to an aspect of the present disclosure, the radio frequency (RF) electrode assembly 160A includes a plurality of lower conductive plates 160_i that are electrically isolated from each other by the insulating material of the susceptor 140. The total number of the conductive plates 160_i can be an integer N that is greater than 1, and each of the conductive plates 160_i can be numerically numbered with a running index i that begins with 1 and ending with N. The integer N may be in a range from 2 to 12, such as from 4 to 8. Each of the conductive plates 160_i may be electrically grounded, or may be connected a respective radio frequency power source 180_i.

Figure 3A:
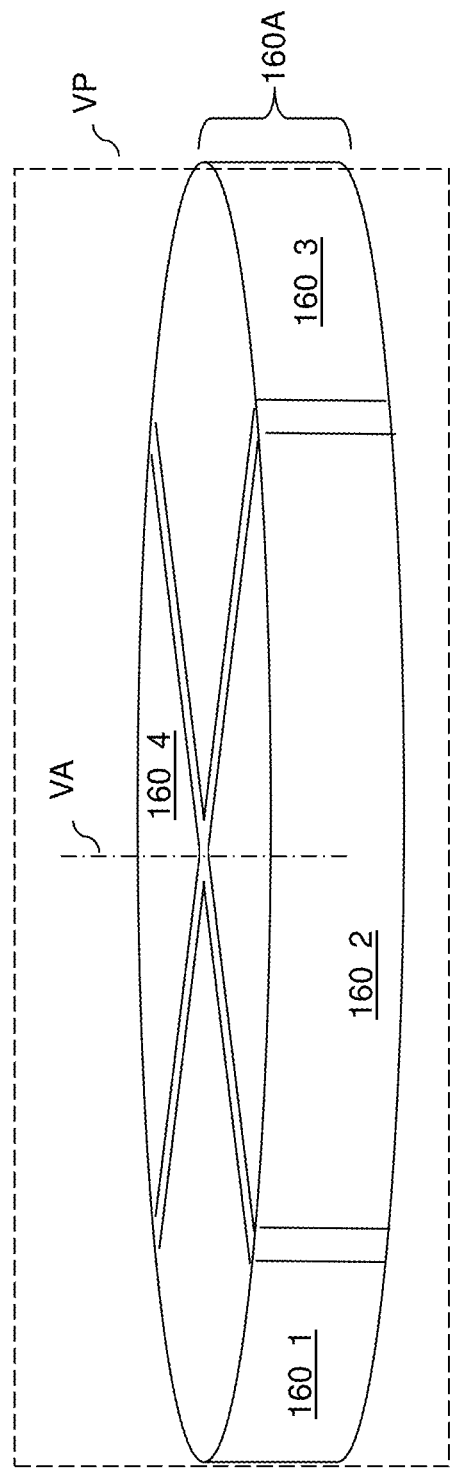
FIG. 3A is a perspective view of a first exemplary configuration of the radio frequency electrode assembly in the first exemplary backside film deposition apparatus according to the first embodiment of the present disclosure.
Figure 3B:
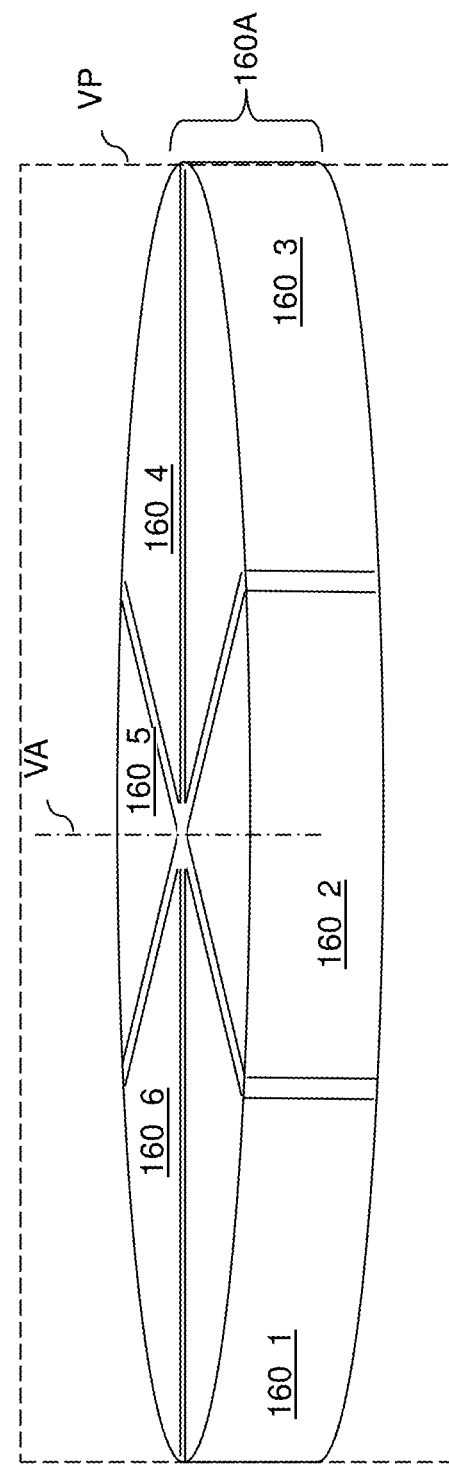
FIG. 3B is a perspective view of a second exemplary configuration of the radio frequency electrode assembly in the first exemplary backside film deposition apparatus according to the first embodiment of the present disclosure.

Referring to FIGS. 3A and 3B, exemplary configurations for the RF electrode assembly 160A is illustrated. Each conductive plate 160_i can have a uniform thickness, and can include a same conductive material, such as a metallic material. Neighboring pairs of conductive plates 160_i can be laterally spaced from each other by uniform spacing to prevent electrical shorts therebetween. In one embodiment, the RF electrode assembly 160A can include vertical dielectric material plates (i.e., portions of the insulating susceptor 140 material) having a uniform lateral thickness that are located between neighboring pairs of conductive plates 160_i. In one embodiment, a continuous dielectric matrix including a bottom plate (i.e., a bottom part of the susceptor 140) may be provided. In this case, the bottom plate may be adjoined to bottom portions of the vertical dielectric material plates.

In case the RF electrode assembly 160A has a circular horizontal cross-sectional shape, the conductive plates 160_i can have a horizontal cross-sectional shape of a respective sector portion of a circle that is formed by dividing a circular or substantially circular shape (e.g., shape of a circular wafer with a wafer flat on one side) into sectors with gaps between sectors. Each divided area corresponds to the area of a respective one of the conductive plates 160_i.

Each conductive plate 160_i may have a limited azimuthal angle range around a vertical axis passing through the geometrical center of the RF electrode assembly 160A. As used herein, a geometrical center of an object refers to the center of gravity of a hypothetical object that occupies a same volume as the object and having a uniform density throughout. For example, the area of the RF electrode assembly 160A may be divided into N azimuthal angle ranges having different azimuthal angle ranges around the vertical axis VA passing through the geometrical center of the RF electrode assembly 160A.

Generally, the plurality of conductive plates 160_i are located within a plurality of conductive plate zones located within different azimuthal angle ranges around the vertical axis VA passing through a geometrical center of the radio frequency electrode assembly 160A. In one embodiment, the plurality of conductive plate zones comprises four or more conductive plate zones having mutually non-overlapping azimuthal angle ranges around the vertical axis VA passing through the geometrical center of the radio frequency electrode assembly 160A. In one embodiment, the azimuthal angle ranges of the plurality of conductive plates 160_i are mutually offset from each other by $2\pi/N$ radians around the vertical axis VA passing through the geometrical center of the radio frequency electrode assembly, in which N is an integer greater than 1 such as an integer in a range from 2 to 12, such as 4 to 8.

In one embodiment, the plurality of conductive plates 160_i comprises N conductive plates in which N is an integer greater than 1, and the N conductive plates 160_i are arranged with an N-fold rotational symmetry around the vertical axis VA passing through the geometrical center of the radio frequency electrode assembly 160A. In one embodiment, the plurality of conductive plates 160_i comprise N conductive plates in which N is an even number, and the N conductive plates are arranged with a mirror symmetry about a vertical plane VP that includes the vertical axis VA passing through the geometrical center of the radio frequency electrode assembly 160A.

In one embodiment, each conductive plate 160_i can have a same shape. In one embodiment, each conductive plate 160_i can have a horizontal cross-sectional shape of a sector of a circle having an azimuthal angle range of $2\pi/N-\delta$ radian, in which the integer N is an integer greater than 1. In one embodiment, the integer N can be in a range from 2 to 12, such as 4 to 8, although a greater number can also be employed. The offset angle $\delta$ may in a range from 0.003 radian to 0.03 radian and is employed to ensure that neighboring conductive plates 160_i do not contact each other. FIG. 3A illustrates a configuration in which the integer N is 4, and FIG. 3B illustrates a configuration in which the integer N is 6.

In one embodiment, each neighboring pair of the plurality of conductive plates 160_i is laterally spaced from each other by a uniform lateral spacing. In one embodiment, top surfaces of the plurality of conductive plates 160_i is located within a common horizontal plane.

Referring back to FIG. 2, the upper electrode 130 including a planar bottom surface can be provided on or below a bottom surface of the top of the vacuum enclosure 110. The upper electrode 130 may be electrically grounded, or may be connected to one or more upper radio frequency (RF) power sources 190. In one embodiment, the upper electrode 130 can have an areal overlap with each of the plurality of conductive plates 160_i in a plan view along a direction that is perpendicular to the vertical axis VA passing through the geometrical center of the RF electrode assembly 160A, which comprise the lower electrode 160 for generating a plasma of a process gas. Each of the lower conductive plates 160_i may be electrically grounded, or may be connected a respective upper radio frequency power source 190_i.

Figure 3C:
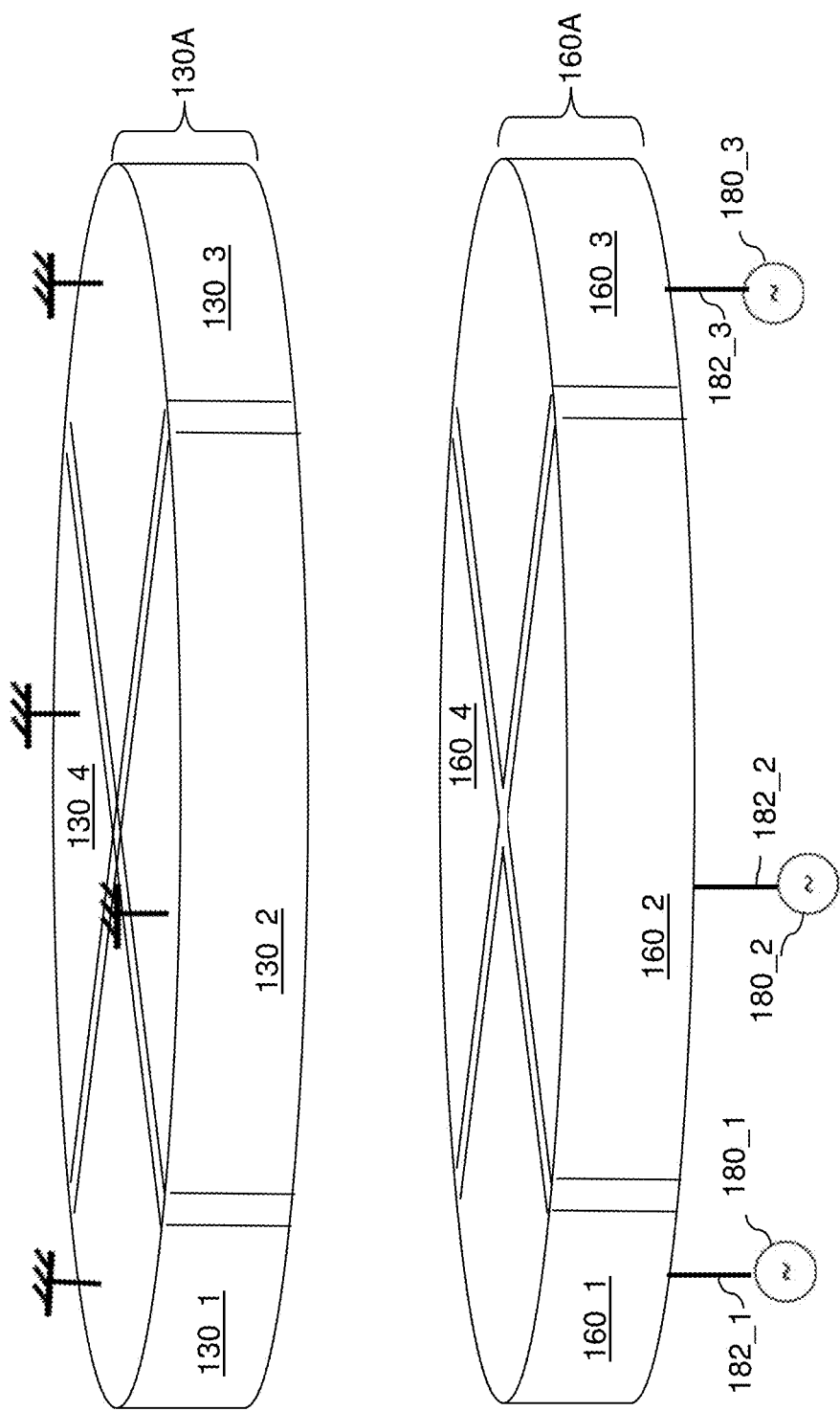
FIG. 3C is a perspective view of a third exemplary configuration of the radio frequency electrode assemblies in the first exemplary backside film deposition apparatus according to the first embodiment of the present disclosure.

According to an aspect of the present disclosure illustrated in FIGS. 3C and 3D, the upper electrode 130 may also include a plurality of upper conductive plates 130_i (i.e., an upper plate RF electrode assembly 130A) that are electrically isolated from each other. The total number of the conductive plates 130_i can be an integer N that is greater than 1, and each of the conductive plates 130_i can be numerically numbered with a running index i that begins with 1 and ending with N. The integer N may be in a range from 2 to 12, such as from 4 to 8. There may be the same number of upper conductive plates 130_i and lower conductive plates 160_i. The upper conductive plates 130_i may have the same sector shape as the lower conductive plates 160_i, and each upper conductive plate 130_i may have a complete areal overlap with each of the respective lower conductive plates 160_i in a plan view along a direction that is perpendicular to the vertical axis VA passing through the geometrical center of the RF electrode assembly 160A.

In one configuration shown in FIG. 3C, each of the lower conductive plates 160_i is connected to a respective lower RF power source 180_i through a respective electrical feedthrough 182_i, in which the index i can be the same as the index i of the respective conductive plate 160_i, while each of the upper conductive plates 130_i is grounded. In an alternative configuration shown in FIG. 3D, each of the lower conductive plates 160_i is grounded, while each of the upper conductive plates 130_i is connected to a respective upper RF power source 190_i through a respective electrical feedthrough 192_i, in which the index i can be the same as the index i of the respective upper conductive plate 130_i. In yet another embodiment, each conductive plate (130_i, 160_$i$) is connected to a respective RF power source (190_$i$, 180_$i$) through a respective electrical feedthrough (182_$i$, 192_$i$).

The first exemplary backside film deposition apparatus 100 includes a plurality of radio frequency (RF) power sources (180_$i$ and/or 190_$i$) configured to apply a respective radio frequency (RF) signal (e.g., RF bias voltage) to respective one of the plurality of the lower and/or upper conductive plates (160_$i$ and/or 130_$i$) to generate a plasma in the plasma zones 150_$i$ between the lower electrode 160 and the upper electrode 130. The RF signals from the plurality of RF power sources (180_$i$, 190_$i$) can be provided to a respective conductive plate (160_$i$, 130_$i$) through a respective electrical feedthrough (182_$i$, 192_$i$) in which the index i can be the same as the index i of the respective conductive plate (160_$i$, 130_$i$).

In one embodiment, the RF signals from the plurality of RF power sources (180_$i$, 190_$i$) can have the same frequency (such as 13.56 MHz) and the same phase to prevent generation of harmonic signals and to minimize interference between signals applied to neighboring pairs of conductive plates (e.g., pairs of lower conductive plates 160_$i$ or pairs of upper conductive plates 130_$i$). However, the RF signals from at least two of the RF power sources (180_$i$, 190_$i$) can have different magnitudes from each other so that each plasma generated in two of the plasma zones 150_$i$ located between the susceptor 140 and the substrate 10 have different plasma characteristics despite the presence of a common set of process gases within each plasma zone. If N conductive plates (160_$i$ and/or 130_$i$) are present within the RF electrode assembly (160A and/or 130_$i$), then N different plasma zones 150_$i$ can be provided during the plasma-enhanced backside stress compensation film 12 deposition process (e.g., PECVD process) that is performed in the first exemplary backside film deposition apparatus 100. Each plasma zone 150_$i$ can be formed between the lower conductive plate 160_$i$ having the same value for the numerical index i and the bottom surface (i.e., backside) of the substrate 10.

In one embodiment, the total number N of the conductive plates (160_$i$, 130_$i$) can be an even number, and the plurality of RF power sources (180_$i$, 190_$i$) can be configured to apply the same first radio frequency power to all odd numbered conductive plates (160_$i$, 130_$i$), and to apply the same second radio frequency power to all even numbered conductive plates (160_$i$+1, 130_$i$+1), where the first RF power is different from the second RF power. For example, if there are four conductive plates (160_$i$, 130_$i$), then a first RF power is applied to the first and third conductive plates, while a second RF power which is different from the first RF power is applied to the second and fourth conductive plates. Thus, the plasma in the odd numbered plasma zones 150_$i$ is different from the plasma in the even numbered zones 150_$i$+1. Each odd numbered conductive plate is located between two even numbered conductive plates, and each even numbered conductive plate is located between two odd numbered conductive plates.

Figure 3E:
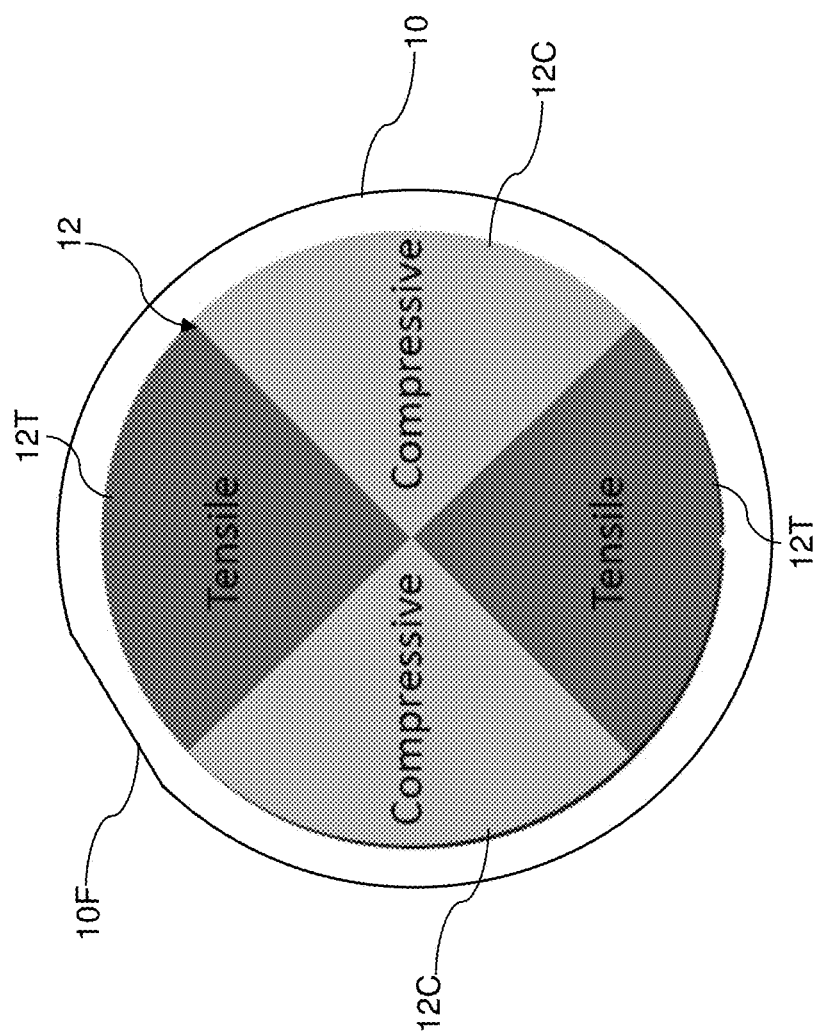
FIG. 3E is a top-down view of a backside stress compensation film deposited on a backside of a substrate.

The present inventors realized that for deposition of a backside stress compensation film 12, such as a silicon nitride layer, the layer may be in compressive or tensile stress depending on the RF power applied during the PECVD process. The backside stress compensation film 12 is deposited on the opposite side of the substrate 10 from the front side of the substrate 10 on which the memory devices 20 are formed, as shown in FIG. 1A. For example, a lower RF power (e.g., 400W to 650W) results in layer with a positive sign of the stress (i.e., tensile stress), while a higher RF power (e.g., 750W to 1000W) results in a layer with a negative sign of the stress (i.e., compressive stress). Thus, as shown in FIG. 3E, the backside stress compensation film 12 has tensile stress sectors 12T which are deposited in the plasma zones 150_$i$ that are generated with a lower RF power from one set (e.g., odd or even numbered set) of conductive plates, and compressive stress sectors 12C which are deposited in the plasma zones 150_$i$ that are generated with a higher RF power from the other set (e.g., even or odd numbered set) of conductive plates. The compressive stress sectors 12C alternate with the tensile stress sectors 12T, such that each compressive stress sector 12C is located between two tensile stress sectors 12T, and each tensile stress sector 12T is located between two compressive stress sectors 12C. If a lower RF power is applied to the even numbered electrically conductive plates than to the odd numbered electrically conductive plates, then the tensile stress sectors 12T in the backside stress compensation film are formed in the plasma zones generated by the even numbered electrically conductive plates, while the compressive stress sectors 12C in the backside stress compensation film are formed in the plasma zones generated by the odd numbered electrically conductive plates, and vice-versa. In one embodiment, the backside stress compensation film 12 comprises a silicon nitride film having less dense tensile stress sectors 12T and more dense compressive stress sectors 12C.

The tensile stress sectors 12T may be formed on backside sectors of the substrate 10 which are under tensile stress, while the compressive stress sectors 12C may be formed on backside sectors of the substrate 10 which are under compressive stress (as defined above with respect to FIG. 1C), to counteract the compressive and tensile stresses on front surface of different sectors of the substrate 10 and to make the substrate more planar (i.e., to decrease the combination warpage shown in FIG. 1B). If the substrate 10 is a semiconductor wafer, such as a silicon wafer, then it may include a wafer flat 10F shown in FIG. 3E.

Thus, first exemplary backside film deposition apparatus 100 of the present disclosure may be employed to deposit a backside stress compensation film 12 having azimuthally-dependent stress characteristics, i.e., a change in the mechanical stress applied from the backside film to the portion of the substrate 10 that overlies the film 12 as a function of the azimuthal angle around the vertical axis passing through the geometrical center of the substrate 10. Thus, such azimuthally-dependent characteristics of the backside stress compensation film 12 can be advantageously employed to compensate for azimuthally dependent combination wafer warpage illustrated in FIG. 1B.

The first exemplary backside film deposition apparatus 100 can include a substrate holder 124 configured to support a substrate 10 by contacting an annular peripheral portion of the backside surface of the substrate 10. The substrate holder 124 can have a ring-shaped horizontal cross-sectional shape, and is configured to "carry," i.e., support, the substrate 10 during a backside film deposition process. As such, the substrate holder 124 is also referred to as a "carrier ring." The substrate holder 124 underlies the upper electrode 130. The substrate holder 124 may include a dielectric material, such as a ceramic material (e.g., alumina) or quartz. The backside stress compensation film 12 is formed on inner portions of the substrate 10 which does not contact the substrate holder 124, as shown in FIGS. 2 and 3E.

In one embodiment, the substrate holder 124 may be placed on support pillars 120 which are supported by and extend above the top surface of the susceptor 140. The support pillars 120 may comprise a dielectric material, such as a ceramic material (e.g., alumina) or quartz, and may have any horizontal cross sectional shape, such as cylindrical, rectangular, semicircular, etc. In one embodiment, a front-side gap 119 may be formed between the front-side surface of the substrate 10 and the bottom surface of the upper electrode 130. The height of the front-side gap 119 may in a range from 1 mm to 10 mm, although lesser and greater heights can also be employed. In one embodiment, a purge gas such as nitrogen, helium, argon, or hydrogen can be flowed into the front-side gap 119 through a purge gas conduit 115, and may be allowed to escape through the pumping port 111 to prevent deposition of any material on the front-side surface of the substrate 10.

In one embodiment, a heater unit 132 may be provided in the vacuum enclosure 110 or on the vacuum enclosure 110. In one embodiment, the heater unit 132 may be embedded within the upper electrode 130 or may be located between the upper electrode 130 and an upper portion of the vacuum enclosure 110, and can be configured to elevate temperature of the upper electrode 130, thereby heating a substrate 10 that is located into the vacuum enclosure 110.

Referring collectively to FIGS. 2 and 3A-3E, a method of operating the first exemplary backside film deposition apparatus 100 includes disposing a substrate 10 on the substrate holder 124 such that the substrate holder 124 supports a peripheral portion of the backside of the substrate 10, and flowing a precursor gas through the gas supply manifold 113 into the vacuum enclosure 110 between the substrate 10 and susceptor 140 which supports the substrate holder 124. The backside stress compensation film (e.g., silicon nitride film) 12 having an azimuthal sector stress modulation around a vertical axis passing through the geometrical center of the substrate 10 can be formed on a backside of substrate 10 by generating a radio frequency plasma of the precursor gas employing the plurality of radio frequency power sources (180_i and/or 190_i). The backside stress compensation film 12 located on the backside of the substrate 10 has a stress modulation across different sectors (12C, 12T) that overlie or underlie different conductive plates (160_i or 130_i) due to the different RF power applied to the different conductive plates to create differences between the plasma in the plasma zones 150_i.

A method of fabricating a semiconductor device according to the first embodiment comprises forming the semiconductor device 20 over a front surface of a substrate 10. The formation of the semiconductor device 20 generates alternating compressive stress sectors in the substrate 10 which are under compressive stress, and tensile stress sectors in the substrate 10 which are under tensile stress. The method also includes depositing a backside stress compensation film 12 in a single deposition step on a backside of the substrate 10. The backside stress compensation film 12 contains alternating compressive stress sectors 12C which are under compressive stress and are located under the compressive stress sectors in the substrate 10, and tensile stress sectors 12T which are under tensile stress and are located under the tensile stress sectors in the substrate 10.

In one embodiment, each of the compressive stress sectors 12C is located between two of the tensile stress sectors 12T, and each of the tensile stress sectors 12T is located between two of the compressive stress sectors 12C in the backside stress compensation film 12. The stress compensation film 12 may be removed from the substrate 10 by selective etching or polishing after formation of the semiconductor devices 20 is complete and before the devices are packaged. Alternatively, the stress compensation film 12 may be left in the devices after they are packaged.

In one embodiment, the method also includes disposing the substrate 10 on a substrate holder 24 located in a vacuum enclosure 110 such that the backside of the substrate 10 facing a susceptor 140 is exposed through the substrate holder 24, flowing a precursor gas into the vacuum enclosure 110 between the substrate 10 and the susceptor 140, and depositing the backside stress compensation film 12 having the alternating tensile stress sectors 12T and compressive stress sectors 12C on the backside of the substrate 10 by plasma enhanced chemical vapor deposition process in which different radio frequency power is provided to plasma zones 150_i adjacent to the compressive stress sectors 12C than to plasma zones 150_i adjacent to the tensile stress sectors 12T of the backside stress compensation film 12.

In one embodiment, the different radio frequency power is applied by different radio frequency power sources 190_i and/or 180_i to different electrically conductive plates 130_i and/or 160_i located in at least one of an upper electrode located 130 over the substrate or a lower electrode 160 located in the susceptor 140 below the substrate 10. Each of the electrically conductive plates overlies or underlies a respective different plasma zone 150_i.

Figure 4A:
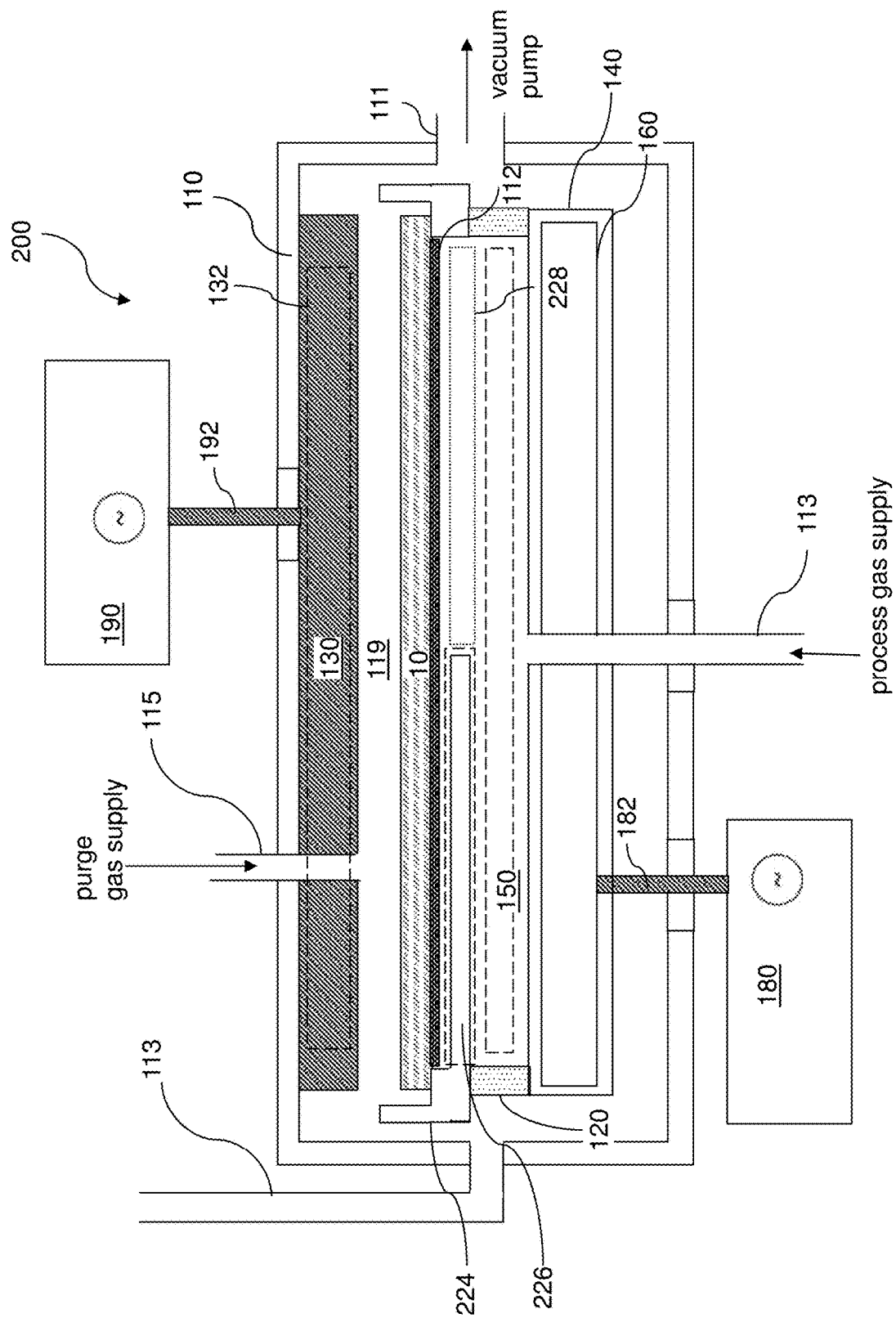
FIG. 4A is a vertical cross-sectional view of a second exemplary backside film deposition apparatus employing a patterned masking plate according to a second embodiment of the present disclosure.
Figure 4B:
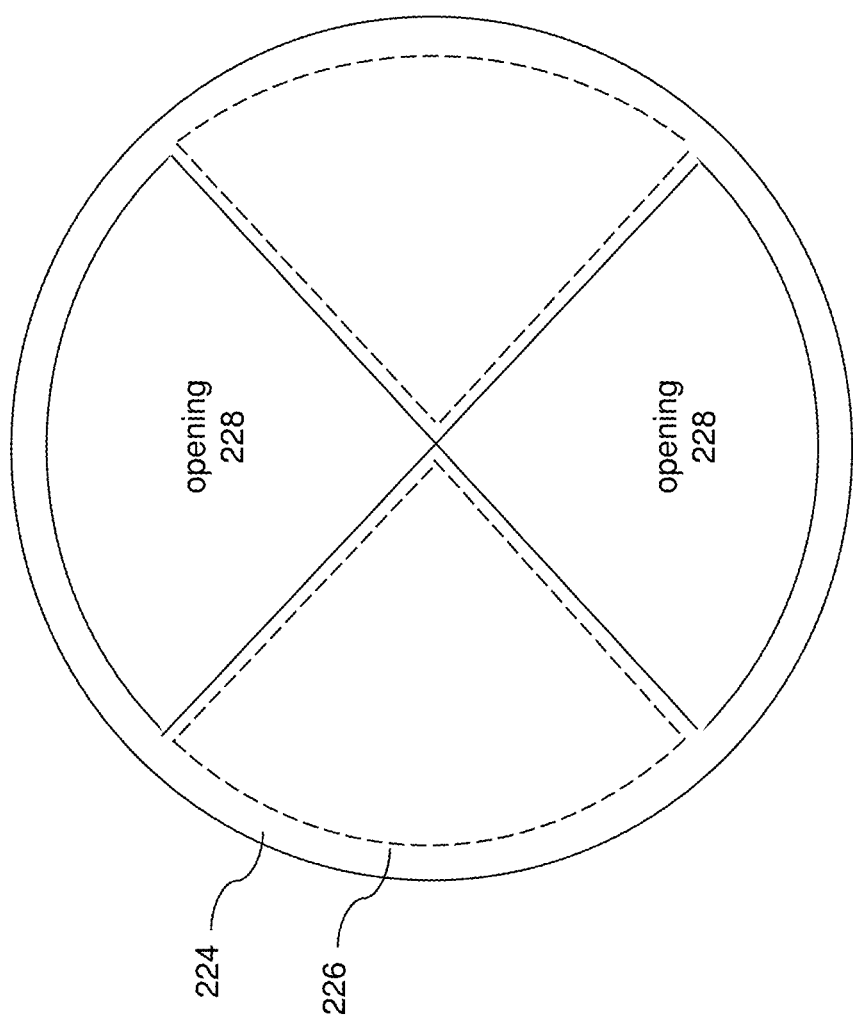
FIG. 4B is a top-down view of the patterned masking plate of FIG. 4A.

Referring to FIGS. 4A and 4B, a second exemplary backside film deposition apparatus 200 according to a second embodiment of the present disclosure is illustrated. The second exemplary backside film deposition apparatus 200 can be derived from the first exemplary backside film deposition apparatus 100 illustrated in FIG. 2 by replacing the lower RF electrode assembly 160A with a single lower electrode 160, by replacing the upper RF electrode assembly 130A with a single upper electrode 130, by replacing the plurality of RF power sources (180_i, 190_i) with a single respective RF power source (180, 190), by replacing the plurality of electrical feedthroughs (182_i, 192_i) with a single respective electrical feedthrough (182, 192), and by employing a combination of a substrate holder 224 and a backside masking plate 226 instead of the substrate holder 124. Optionally, the gas supply manifold 113 may extend into a single plasma zone 150 through the susceptor 140.

The substrate holder 224 includes an annular (i.e., ring-shaped) portion having a same geometrical shape as the substrate holder 124 of the first exemplary backside film deposition apparatus 100. The backside masking plate 226 can be connected to (e.g., attached to or integrated with), the substrate holder 224. For example, the backside masking plate 226 may be a discrete component that is attached to the substrate holder 224, or the backside masking plate 226 and the substrate holder 224 may be formed as an integrated structure, i.e., a single continuous structure. The backside masking plate 226 has a shape that partially covers the planar top surface of the lower electrode 160, and thus, partially covers the backside surface of the substrate 10 when the substrate 10 is loaded onto the substrate holder 224.

Generally, the backside masking plate 226 can have a planar top surface, a planar bottom surface, and at least one opening 228 therethrough. The backside masking plate 226 can have a shape of at least two sectors of a circle, which are connected to the substrate holder 224 at their curved surfaces. Preferably, the plate 226 has at least two openings 228. Each opening 228 through the backside masking plate 226 also has a shape of a sector of a circle. In one embodiment, the at least one opening 228 in the backside masking plate 226 comprises a plurality of openings arranged in a configuration having an n-fold rotational symmetry around a vertical axis passing through a geometrical center of the radio frequency electrode 160. The integer n is greater than 1, and may be 2, 3, 4, 5, 6, etc. In one embodiment, the plurality of openings 228 in the backside masking plate 226 may have an n-fold rotational symmetry such as a 2-fold rotational symmetry, a 3-fold rotational symmetry, a 4-fold rotational symmetry, a 6-fold rotational symmetry, etc. In one embodiment, the plurality of openings 228 in the backside masking plate 226 may have a 2-fold rotational symmetry.

In one embodiment, the at least one opening 228 through the backside masking plate 226 may have a mirror symmetry around a vertical plane passing including a vertical axis passing through the geometrical center of the substrate 10. Generally, the backside masking plate 226 covers a fraction of the entire area of the planar bottom surface of the upper electrode 130. In one embodiment, the fraction may be in a range from 0.1 to 0.9, such as from 0.2 to 0.8, and/or from 0.3 to 0.7, and/or from 0.4 to 0.6. In one embodiment, the backside masking plate 226 comprises a dielectric material (such as quartz or alumina) and is vertically spaced from the susceptor 140 by a uniform vertical spacing.

The lower electrode 160 includes a conductive plate, and is located underneath the substrate holder 224. The upper electrode 130 includes a conductive plate, and is located above the substrate holder 224. At least one radio frequency (RF) power source (180, 190) is configured to apply a radio frequency (RF) signal to the lower and/or upper electrode (160, 130) to generate a plasma in the plasma zone 150, which is located between the susceptor 140 and the substrate 10 located on the substrate holder 224.

Figure 5:
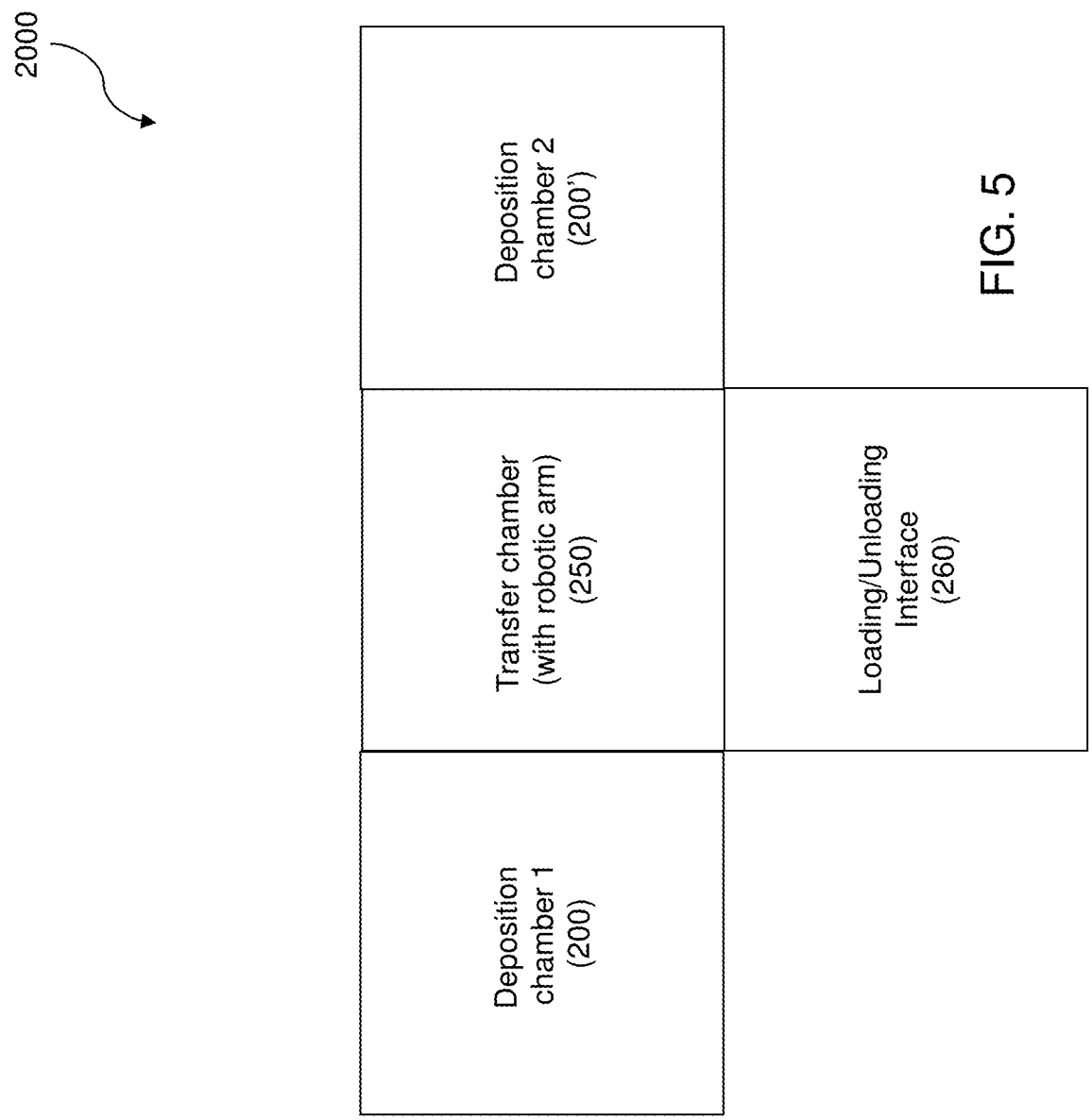
FIG. 5 is a schematic plan view of an exemplary backside film deposition system according to the second embodiment of the present disclosure.

Referring to FIG. 5, a backside film deposition system 2000 according to the second embodiment of the present disclosure is provided, which includes a transfer chamber 250 including a robotic arm for transferring a substrate 10, a first backside film deposition apparatus 200 connected to the transfer chamber, a second backside film deposition apparatus 200' connected to the transfer chamber, and a loading/unloading interface 260 configured to load the substrate 10 for backside stress compensation film 112 deposition and to unload the substrate 10 after backside stress compensation film 112 deposition. The first backside film deposition apparatus 200 can have the same configuration as the second exemplary backside film deposition apparatus 200 illustrated in FIGS. 4A and 4B. For example, the openings 228 in the backside masking plate 226 can have a pattern having a 2-fold rotational symmetry around a vertical axis passing through the lower electrode 160. In other words, there are two sector shaped openings 228 in the backside masking plate 226, and each opening 228 is located between two sector shaped portions of the backside making plate 226 and vice-versa. The second backside film deposition apparatus 200' can have the same configuration as the second exemplary backside film deposition apparatus 200 illustrated in FIGS. 4A and 4B with a modification to the pattern of openings 228 through a respective backside masking plate 226, shown in FIG. 6.

Figure 6:
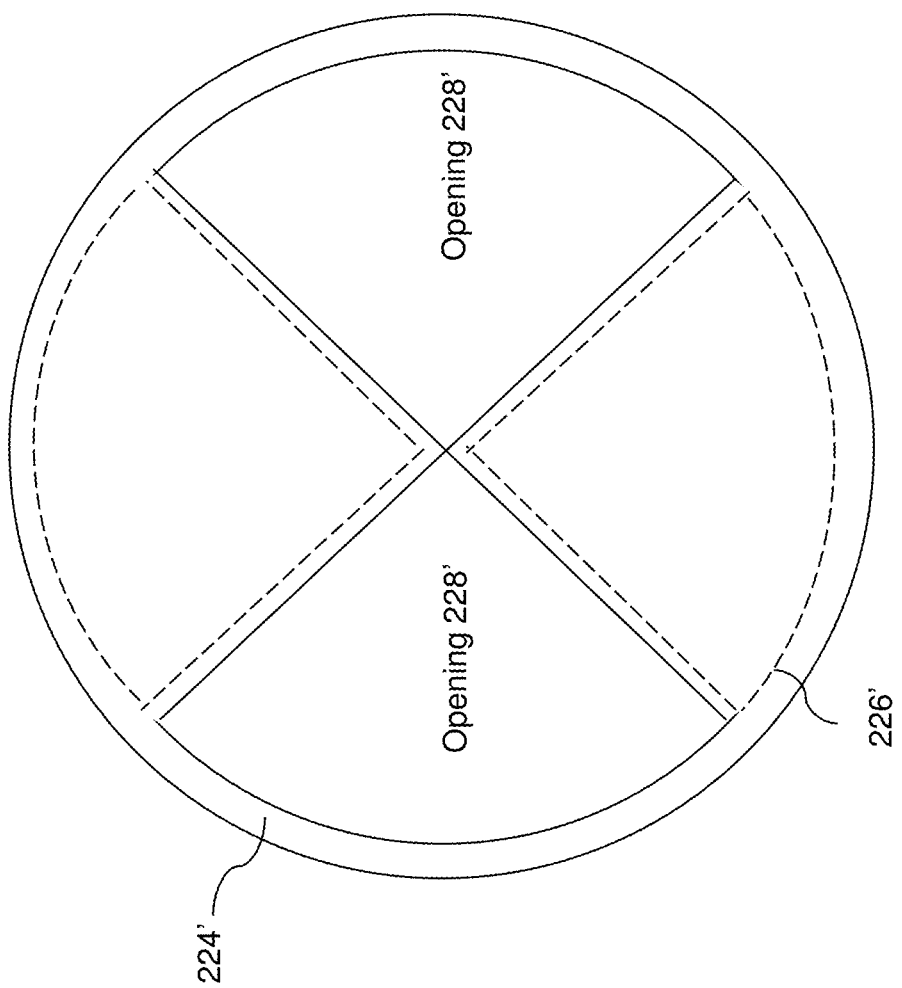
FIG. 6 is a top-down view of a patterned masking plate of an additional backside film deposition apparatus according to the second embodiment of the present disclosure.

Referring to FIG. 6, a backside masking plate 226' within the second backside film deposition apparatus 200' of FIG. 5 is illustrated. The pattern of openings 228' through the backside masking plate 226' within the second backside film deposition apparatus 200' can be different from the pattern of openings 228 in the backside masking plate 226 within the first backside film deposition apparatus 200. For example, the pattern of the openings 228 in the backside masking plate 226 in the first backside film deposition apparatus 200 can have an n-fold symmetry, and the pattern of openings 228' in the backside masking plate 226' in the second backside film deposition apparatus 200' can be rotated from the pattern of openings 228 in the backside masking plate 226 in the first backside film deposition apparatus 200 by $\pi/n$ radian. In an illustrative example, if the pattern of the openings 228 in the backside masking plate 226 in the first backside film deposition apparatus 200 can have a 2-fold symmetry, then the pattern of openings 228' in the backside masking plate 226' in the second backside film deposition apparatus 200' can be rotated from the pattern of openings 228 in the backside masking plate 226 in the first backside film deposition apparatus 200 by $\pi/2$ radian, i.e., by 90 degrees. In other words, the location of each sector shaped portion of the masking plate 226 in the apparatus 200 is replaced with a sector shaped opening 228' in the apparatus 200', while the location of each sector shaped opening 228 in the apparatus 200 is replaced with a sector shaped portion of the masking plate 226' in the apparatus 200'. The upward direction in each pattern of openings (228, 228') in the backside masking plates (226, 226') in each of FIGS. 4B and 6 exposes the backside of the substrate 10.

The first backside film deposition apparatus 200 and the second backside film deposition apparatus 200' comprise separate CVD deposition chambers which can be sequentially employed to deposit two different types of films on different portions of the backside of the substrate 10 to form a composite backside stress compensation film 112 comprising a compressive stress film sectors 112C and tensile stress film sectors 112T having different chemical compositions from each other.

The compressive stress film sectors 112C may comprise undoped silicate glass (e.g., silicon oxide) sectors, and tensile stress film sectors 112T may comprise silicon nitride sectors. The undoped silicate glass (e.g., silicon oxide) sectors 112C may be located under the sectors of the substrate 10 in compressive stress, while silicon nitride sectors 112T may be located under the sectors of the substrate 10 in tensile stress to reduce the composite warpage of the substrate 10 shown in FIG. 1B.

For example, a first-type backside film (e.g., silicon oxide film of sectors 112C) can be deposited in the first sector and the third sector of the backside of the substrate 10 that are azimuthally rotated from each other by $\pi$ radian (180 degrees) by performing a first backside film deposition process in the first backside film deposition apparatus 200, and a second-type backside film (e.g., silicon nitride film of sectors 112T) having a different material composition and a different sign stress applied by the film to the substrate 10 can be deposited in the second sector and the fourth sector of the backside of the substrate 10 by performing a second backside film deposition process in the second backside film deposition apparatus 200'. The order of deposition of the silicon oxide and silicon nitride films may be reversed.

In an alternative embodiment, a same backside film deposition chamber (such as the second exemplary backside film deposition apparatus 200 of FIGS. 4A and 4B) can be employed to sequentially deposit two backside films with a substrate rotation between the two backside film deposition processes. For example, the pattern of the openings 228 in the backside masking plate 226 in the backside film deposition apparatus (such as the second exemplary backside film deposition apparatus 200 of FIGS. 4A and 4B) can have an n-fold symmetry, and the substrate 10 can be rotated by $\pi/n$ radian between the first backside film deposition process and the second backside film deposition process.

Referring collectively to FIGS. 4A, 4B, 5, and 6 and according to various embodiments of the present disclosure, a method of forming a composite backside stress compensation film 112 is provided. The method includes disposing a substrate 10 on a substrate holder 224 located in a vacuum enclosure 110 such that at least two sectors of a backside of the substrate 10 facing a susceptor 140 are exposed through at least two sector shaped openings 228 in a first patterned backside masking plate 226 connected to the substrate holder 224. The method also includes flowing a precursor gas (e.g., silane and a nitrogen containing gas, such as ammonia and/or atomic nitrogen, to deposit silicon nitride, or silane and an oxygen containing gas, such as atomic oxygen or $N_2O$ to deposit silicon oxide) into the vacuum enclosure 110 between the substrate 10 and the susceptor 140, and depositing a first backside stress compensation film 112C or 112T having a compressive or tensile stress in at least two odd numbered sectors on the backside of the substrate 10 through the at least two sector shaped openings 228 in the first patterned backside masking plate 226. The method also includes depositing a second backside stress compensation film 112T or 112C having another one of the compressive or tensile stress in at least two even numbered sectors on the backside of the substrate 10. Each of the odd numbered sectors is located between two even numbered sectors and the second backside stress compensation film has a different chemical composition than the first backside stress compensation film 112.

In one aspect, the step of depositing the second backside stress compensation film comprises rotating the substrate 10 relative to the substrate holder 224 such that the at least two sector shaped openings 228 in the first patterned backside masking plate 226 expose the even numbered sectors on the backside of the substrate 10, and depositing the second backside stress compensation film through the at least two sector shaped openings 228 in the first patterned backside masking plate 226 in the even numbered sectors on the backside of the substrate 10.

In another aspect, the step of depositing the second backside stress compensation film comprises disposing the substrate 10 on second substrate holder 224' located in second vacuum enclosure of apparatus 200', and depositing the second backside stress compensation film through at least two sector shaped openings 228' in a second patterned backside masking plate 226' in the even numbered sectors on the backside of the substrate 10 in the second vacuum enclosure.

The first backside stress compensation film may comprise an undoped silicate glass (e.g., silicon oxide) film 112C which applies a compressive stress to the odd numbered sectors on the backside of the substrate 10 which are under compressive stress from semiconductor devices 20 located over a front side of the substrate 10. The second backside stress compensation film may comprise a silicon nitride film 112T which applies a tensile stress to the even numbered sectors on the backside of the substrate 10 which are under tensile stress from the semiconductor devices 20 located over the front side of the substrate 10. Alternatively, the silicon nitride film 112T may be formed first followed by forming the silicon oxide film 112C.

In one embodiment, the second film 112T does not overlap with the first film 112C, or has an overlap area with the first film 112C that is less than 10% of an entire area of the second film 112T. In one embodiment, a combination of the first backside stress compensation film 112C and the second backside stress compensation film 112T covers at least 90% of an entire area of the backside surface of the substrate 10. In one embodiment, the composite backside stress compensation film 112 has an azimuthally varying material composition such that n first film 112C sectors and n second film sectors 112T alternate azimuthally, i.e., along a direction of 360 degree rotation about a vertical axis passing through a geometrical center of the substrate 10. The integer n may be 2, 3, 4, 5, 6, etc.

Figure 7:
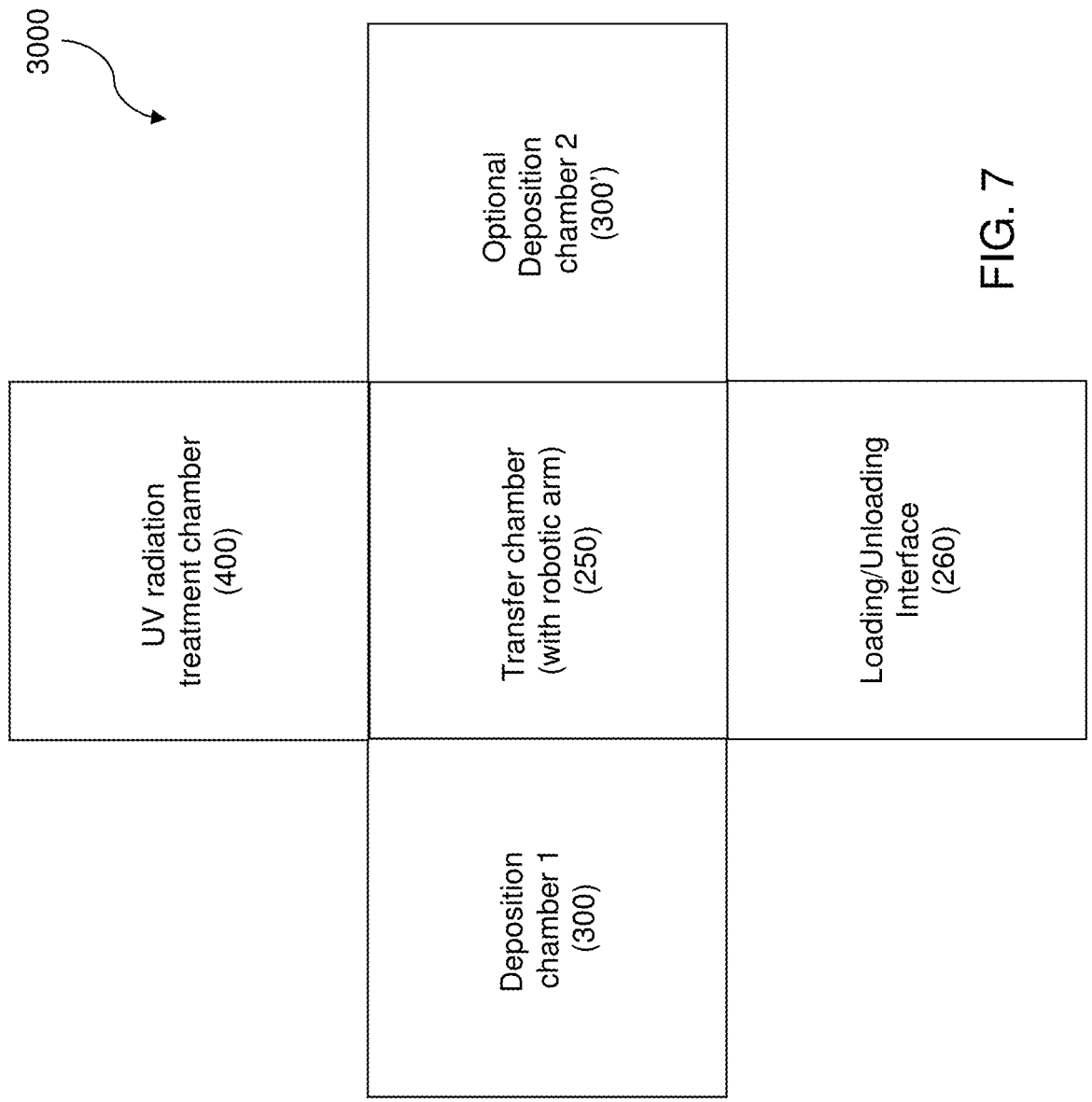
FIG. 7 is a schematic plan view of an exemplary backside film deposition system according to a third embodiment of the present disclosure.

Referring to FIG. 7, an exemplary backside film deposition system 3000 according to a third embodiment of the present disclosure is illustrated. The exemplary backside film deposition system 3000 includes a transfer chamber 250 including a robotic arm for transferring a substrate 10, a backside film deposition apparatus (i.e., chamber) 300 connected to the transfer chamber 250, an ultraviolet radiation treatment chamber 400 connected to the transfer chamber 250, and a loading/unloading interface 260 configured to load the substrate 10 for backside stress compensation film deposition and to unload the substrate 10 after the backside stress compensation film deposition. Optionally, at least one additional backside film deposition apparatus (i.e., chamber) 300' and/or at least one additional ultraviolet radiation treatment chamber (not shown) can be provided in order to increase the throughput of the exemplary backside film deposition system 3000.

Generally, the exemplary backside film deposition system 3000 includes the backside stress compensation film deposition chamber 300 configured to deposit the backside stress compensation film 212 on the backside of the substrate 10 that is not covered by a substrate holder 124, the ultraviolet radiation treatment chamber 400, and the transfer chamber 250 adjoined to the backside film deposition chamber 300 and the ultraviolet radiation treatment chamber 400.

Figure 8:
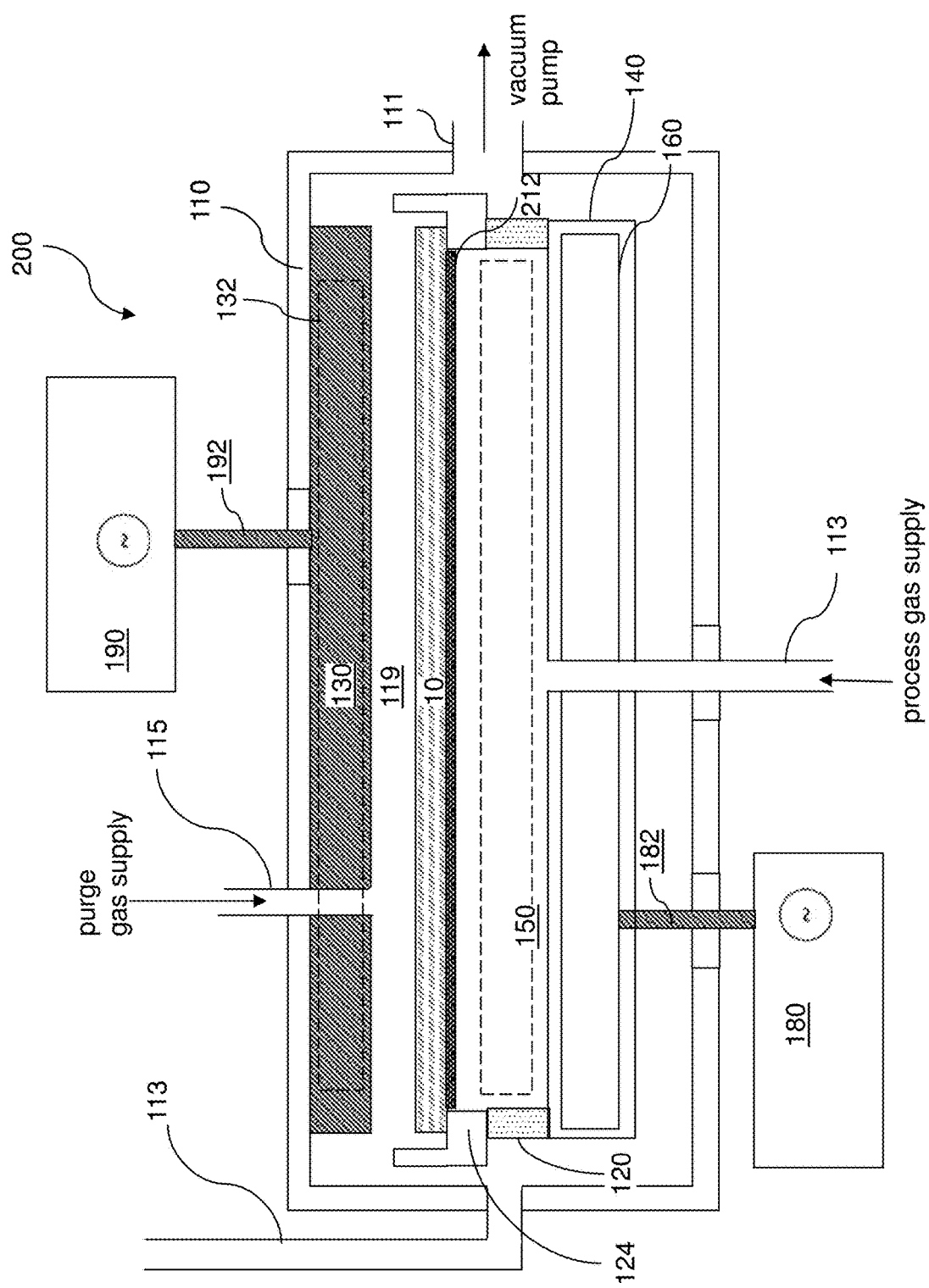
FIG. 8 is a vertical cross-sectional view of a backside film deposition chamber of the third exemplary backside film deposition apparatus of FIG. 7.

Referring to FIG. 8, the backside film deposition apparatus 300 within the exemplary backside film deposition system 3000 of FIG. 7 is illustrated. The backside film deposition apparatus 300 of FIG. 8 can be derived from the second exemplary backside film deposition apparatus 200 of FIG. 4A by omitting the backside masking plate 226. Thus, a uniform backside stress compensation film 212 having a uniform stress throughout can be deposited on the portion of the backside of the substrate 10 that is not covered by the substrate holder 124. In one embodiment, the uniform backside stress compensation film 212 may comprise a silicon nitride film having a compressive stress throughout its entire area deposited by PECVD at a relatively high RF power.

Figure 9:
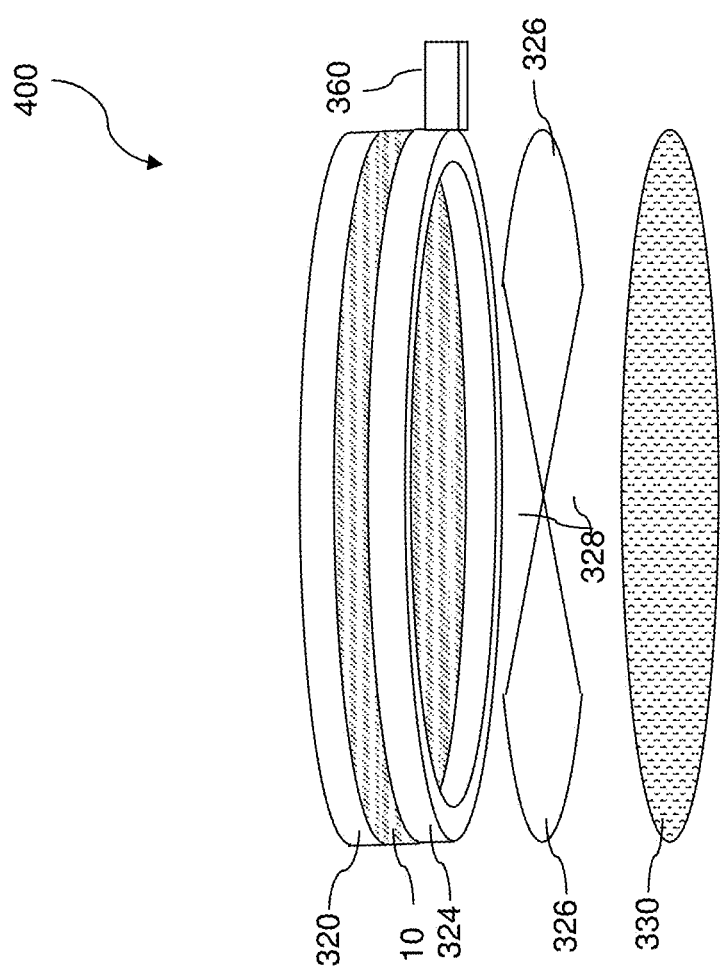
FIG. 9 is a vertical cross-sectional view of an ultraviolet radiation treatment chamber of the third exemplary backside film deposition apparatus of FIG. 7.

Referring to FIG. 9, internal components of the ultraviolet radiation treatment chamber 400 (i.e., the portion of the ultraviolet radiation treatment chamber 400 other than a vacuum enclosure and components attached to the outside of the vacuum enclosure) are illustrated. The ultraviolet radiation treatment chamber 400 includes a lower support ring 324 configured to hold a substrate 10 thereupon, a backside masking plate 326 located underneath the lower support ring 324 and including at least one opening 328 therethrough, and an ultraviolet radiation source (e.g., at least one UV lamp) 330 located underneath the backside masking plate 326. The lower support ring 324 can have an annular shape, i.e., a ring shape, and can support the substrate 10 upon being placed into the ultraviolet radiation treatment chamber 400, for example, by a robotic arm in the transfer chamber 250. An upper support ring 320 may be optionally provided so that the substrate 10 can be held in a fixed position during the backside ultraviolet irradiation process.

In one embodiment, if the substrate 10 is a semiconductor wafer, then the substrate may be azimuthally aligned with the backside masking plate 326 using the wafer flat for orientation. The backside masking plate 326 can be connected to the lower support rings 324 or may be suspended between the lower support ring 324 and the ultraviolet radiation source 330 by any suitable mechanical means such as a support bar 360 that is attached to the vacuum enclosure of the ultraviolet radiation treatment chamber 400.

The pattern of the at least one opening 328 through the backside masking plate 326 can be any of the pattern of the opening(s) 228 through the backside masking plate 226 described above. The backside masking plate 326 can have a shape of at least two sectors of a circle, which may be connected to the support ring 324 at their curved surfaces. Preferably, the plate 326 has at least two openings 328. Each opening 328 through the backside masking plate 326 also has a shape of a sector of a circle. In one embodiment, the at least one opening 328 comprises a plurality of openings 328 located at different azimuthal angle ranges around a vertical axis passing through a geometrical center of the backside masking plate 326. In one embodiment, the plurality of openings in the backside masking plate 326 are mutually offset among one another by $2\pi/N$ radians around the vertical axis passing through the geometrical center of the backside masking plate 326. N is an integer greater than 1 such as 2, 3, 4, 5, 6, etc. In one embodiment, the plurality of openings 328 in the backside masking plate 326 have an N-fold rotational symmetry around the vertical axis passing through the geometrical center of the backside masking plate 326. In one embodiment, the plurality of openings 328 in the backside masking plate 326 have a two-fold rotational symmetry around the vertical axis passing through the geometrical center of the backside masking plate 326.

In one embodiment, the lower support ring 324 has an annular shape, and the backside masking plate 326 covers a fraction of a total area within an inner periphery of the annular shape of the lower support ring 324. The fraction can be in a range from 0.1 to 0.9, such as from 0.2 to 0.8 and/or from 0.3 to 0.7 and/or from 0.4 to 0.6.

The ultraviolet radiation source 330 can be configured to emit directional ultraviolet radiation upward. The peak wavelength of photons emitted from the ultraviolet radiation source 330 can be concentrated in the ultraviolet wavelength range. The ultraviolet radiation source 330 may emit at least 50% of the radiation energy through photons having a wavelength in a range from 100 nm to 400 nm.

In one embodiment, the backside masking plate 326 comprises a top surface that faces upward and comprises an ultraviolet radiation absorbing material. In this case, collateral irradiation of sectors of the backside stress compensation film 212 in compressive stress masked by the backside masking plate 326 on the substrate 10 can be minimized. Thus, only the sectors of the backside stress compensation film 212 exposed through the openings 328 are irradiated with ultraviolet radiation from the radiation source 330 to convert the film 212 of these sectors from compressive stress to tensile stress.

Figure 10:
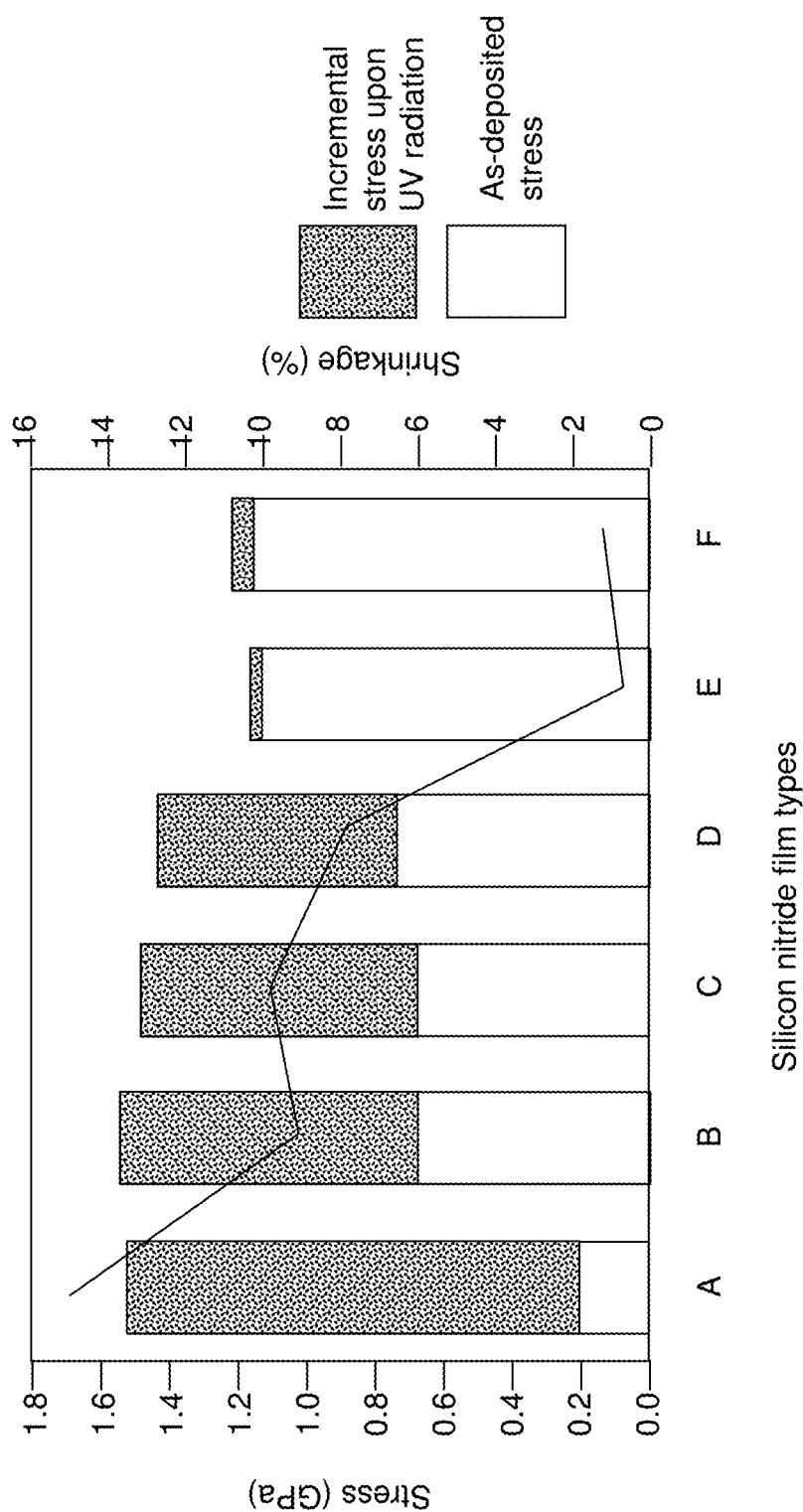
FIG. 10 is a graph illustrating changes in the stress that silicon nitride films generate upon treatment with ultraviolet radiation.

Referring to FIG. 10, a graph that illustrates changes in the stress that silicon nitride films generated upon treatment with ultraviolet radiation, based on a graph that is described in J. Tian, et. al., Japanese Journal of Applied Physics 49 (2010) 05FB01, incorporated herein by reference in its entirety.

A silicon nitride film 212 deposited on the backside of the substrate 10 prior to ultraviolet radiation may apply a compressive stress to the substrate 10 if the film is deposited at a relatively high RF power. Upon irradiation with ultraviolet radiation, the stress of the silicon nitride film becomes more tensile due to breakage of bonds at the atomic level within the silicon nitride material. Thus, a silicon nitride film 212 in compressive stress prior to ultraviolet irradiation can be in tensile stress after irradiation with ultraviolet radiation.

Referring collectively to FIGS. 7-10 and according to the third embodiment of the present disclosure, a method of fabricating a semiconductor device comprises providing a substrate 10 containing a semiconductor device 20 located over a front surface of a substrate which generates alternating compressive stress sectors in the substrate which are under compressive stress and tensile stress sectors in the substrate which are under tensile stress, and a backside stress compensation film 212 under compressive stress located on a backside of the substrate 10, and irradiating even numbered sectors of the backside stress compensation film 212 with ultraviolet radiation such that the even numbered sectors of the backside stress compensation film are under tensile stress while odd numbered sectors of the backside stress compensation film remain under compressive stress, to achieve a sector configuration similar to that shown in FIG. 3E.

The even numbered sectors of the backside stress compensation film 212 are located under the tensile stress sectors in the substrate, and the odd numbered sectors of the backside stress compensation film are located under the compressive stress sectors in the substrate 10. In one embodiment, each of the odd numbered sectors is located between two of the even numbered sectors, and each of the even numbered sectors is located between two of the odd numbered sectors.

In one embodiment, the method also includes disposing the substrate 10 on a substrate holder 124 located in a vacuum enclosure 110 of the deposition chamber 300 such that the backside of the substrate facing a susceptor 140 is exposed through the substrate holder 124, as shown in FIG. 8, flowing a precursor gas (e.g., silane, ammonia and/or atomic nitrogen) into the vacuum enclosure 110 between the substrate 10 and the susceptor 140, and depositing the backside stress compensation film 212 under compressive stress on the backside of the substrate 10 by plasma enhanced chemical vapor deposition process. In one embodiment, the backside stress compensation film 212 comprises a silicon nitride film. In one embodiment, after depositing the backside stress compensation film 212 in in a deposition chamber 300 of a cluster tool (e.g. system 3000), the method also includes transferring the substrate 10 to an ultraviolet radiation treatment chamber 400 of the cluster tool 3000 through a transfer chamber 250.

In one embodiment, the step of irradiating the even numbered sectors of the backside stress compensation film 212 with ultraviolet radiation comprises passing the ultraviolet radiation from a radiation source 330 through sector shaped openings 228 in a backside masking plate 226 exposing the even numbered sectors of the backside stress compensation film 212. Sector shaped portions of the backside masking plate 226 mask the odd numbered sectors of the backside stress compensation film 212 during the step of irradiating the even numbered sectors of the backside stress compensation film 212 with ultraviolet radiation.

The various embodiments of the present disclosure can be employed to form at least one composite backside stress compensation film having compressive and tensile stress sectors which counteract the combination wafer warpage shown in FIG. 1B.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A backside film deposition apparatus, comprising:
    a vacuum enclosure;
    an upper electrode located within the vacuum enclosure;
    a susceptor located within the vacuum enclosure;
    a lower electrode located within the susceptor;
    a hollow ring shaped substrate holder located between the upper electrode and the susceptor and configured to support a substrate such that a plurality of plasma zones are located between the substrate holder and the susceptor; and
    a plurality of radio frequency power sources;
    wherein:
    at least one of the upper electrode or the lower electrode comprises a radio frequency electrode assembly comprising a plurality of conductive plates that are electrically isolated from each other;
    the plurality of radio frequency power sources are configured to apply different power to different conductive plates to generating a different plasmas in different plasma zones to deposit a backside stress compensation film having tensile and compressive stress sectors on a backside of a substrate facing the susceptor; and
    both the upper electrode and the lower electrode include sector shaped electrically conductive plates.

2. The backside film deposition apparatus of claim 1, further comprising:
    a gas supply manifold configured to provide influx of gas into the vacuum enclosure; and
    a pumping port connected to the vacuum enclosure.

3. The backside film deposition apparatus of claim 1, further comprising support pillars located on an upper surface of the susceptor, wherein the substrate holder is located on the support pillars.

4. The backside film deposition apparatus of claim 1, wherein:
    the radio frequency electrode assembly has a circular horizontal shape; and
    the sector shaped conductive plates have shapes of sectors of the circular horizontal shape and are located within a plurality of conductive plate zones located within different azimuthal angle ranges around a vertical axis passing through a geometrical center of the radio frequency electrode assembly.

5. The backside film deposition apparatus of claim 4, wherein the plurality of conductive plate zones comprise four or more conductive plate zones having mutually non-overlapping azimuthal angle ranges around the vertical axis passing through the geometrical center of the radio frequency electrode assembly.

6. The backside film deposition apparatus of claim 4, wherein each neighboring pair of the plurality of conductive plates is laterally spaced from each other by a uniform lateral spacing.

7. The backside film deposition apparatus of claim 4, wherein:
    the plurality of conductive plates comprises N conductive plates in which N is an integer greater than 1; and
    the N conductive plates are arranged with an N-fold rotational symmetry around a vertical axis passing through a geometrical center of the radio frequency electrode assembly.

8. The backside film deposition apparatus of claim 7, wherein:
    N is an even number greater than 2;
    each odd numbered conductive plate is located between two even numbered conductive plates;
    each even numbered conductive plate is located between two odd numbered conductive plates; and
    the plurality of radio frequency power sources are configured to apply the same first radio frequency power to all odd numbered conductive plates, and to apply the same second radio frequency power to all even numbered conductive plates, where the first radio frequency power is different from the second radio frequency power.

9. A backside film deposition apparatus, comprising:
    a vacuum enclosure;
    an upper electrode located within the vacuum enclosure;
    a susceptor located within the vacuum enclosure;
    a lower electrode located within the susceptor;
    a hollow ring shaped substrate holder located between the upper electrode and the susceptor and configured to support a substrate such that a plurality of plasma zones are located between the substrate holder and the susceptor; and
    a plurality of radio frequency power sources;
    wherein:
    at least one of the upper electrode or the lower electrode comprises a radio frequency electrode assembly comprising a plurality of conductive plates that are electrically isolated from each other;
    the plurality of radio frequency power sources are configured to apply different power to different conductive plates to generating a different plasmas in different plasma zones to deposit a backside stress compensation film having tensile and compressive stress sectors on a backside of a substrate facing the susceptor;
    the radio frequency electrode assembly has a circular horizontal shape;
    the plurality of conductive plates have shapes of sectors of the circular horizontal shape and are located within a plurality of conductive plate zones located within different azimuthal angle ranges around a vertical axis passing through a geometrical center of the radio frequency electrode assembly;
    the plurality of conductive plates comprises N conductive plates in which N is an integer greater than 2;
    the N conductive plates are arranged with an N-fold rotational symmetry around a vertical axis passing through a geometrical center of the radio frequency electrode assembly;
    each odd numbered conductive plate is located between two even numbered conductive plates;
    each even numbered conductive plate is located between two odd numbered conductive plates; and
    the plurality of radio frequency power sources are configured to apply the same first radio frequency power to all odd numbered conductive plates, and to apply the same second radio frequency power to all even numbered conductive plates, where the first radio frequency power is different from the second radio frequency power.

\* \* \* \* \*